(12) United States Patent
Sokolov et al.

(10) Patent No.: US 8,232,825 B2
(45) Date of Patent: Jul. 31, 2012

(54) SELF-TIMED RS-TRIGGER WITH THE ENHANCED NOISE IMMUNITY

(75) Inventors: Igor Anatolievich Sokolov, Moscow (RU); Yury Afanasievich Stephchenkov, Moscow (RU); Yury Georgievich Dyachenko, Voskresensk (RU)

(73) Assignee: Institute of Informatics Problems of The Russian Academy of Sciences (IPI RAN), Moscow (RU)

(*) Notice: Subject to any disclaimer, the term of this patent is extended or adjusted under 35 U.S.C. 154(b) by 13 days.

(21) Appl. No.: 13/055,170

(22) PCT Filed: May 28, 2010

(86) PCT No.: PCT/RU2010/000279
§ 371 (c)(1),
(2), (4) Date: Jan. 21, 2011

(87) PCT Pub. No.: WO2011/002337
PCT Pub. Date: Jan. 6, 2011

(65) Prior Publication Data
US 2011/0121877 A1    May 26, 2011

(30) Foreign Application Priority Data
Jul. 1, 2009   (RU) ............................... 2009124990

(51) Int. Cl.
    *H03K 3/037*    (2006.01)
(52) U.S. Cl. ...................................... 327/217; 327/225
(58) Field of Classification Search ............... 327/217, 327/225
    See application file for complete search history.

(56) References Cited

U.S. PATENT DOCUMENTS

| 3,609,569 A * | 9/1971 | Todd ............................... 327/202 |
| 5,994,936 A * | 11/1999 | Johnson et al. ............... 327/217 |
| 6,362,674 B1 * | 3/2002 | Kermani ...................... 327/217 |
| 7,697,319 B2 * | 4/2010 | Dedieu et al. ................. 365/154 |

FOREIGN PATENT DOCUMENTS

| EP | 0905892 A2 | 3/1999 |
| RU | 2319297 C1 | 3/2008 |
| SU | 1480098 A1 | 5/1989 |
| WO | 00/18010 A1 | 3/2000 |

OTHER PUBLICATIONS

V.L. Shilo, "Popularnye Tsifrovye Mikroskhemy (Popular Digital Microcircuits)," Reference Book, Second edition, corrected, Chelyabinsk, Metallurgy, Chelyabinsk Branch Office, 1989, with translation, 6 pages.

(Continued)

*Primary Examiner* — Patrick O'Neill
(74) *Attorney, Agent, or Firm* — Osha Liang LLP

(57) ABSTRACT

The invention describes self-timed RS-trigger with the enhanced noise immunity. Declared effect is achieved due to that circuit containing storage unit (1), indication unit (2), paraphase data input (3, 4), paraphase data output (5, 6), and indication output (7), is modified by adding two inverters (8, 9) and preindication unit (10). Inverters increase output capability of the trigger's paraphase data output and provide an electric isolation of the outputs of the storage unit from an external environment that leads to increasing immunity of the data stored in the trigger to influence of noises at signal wires. The preindication unit provides the trigger's indicatability.

30 Claims, 15 Drawing Sheets

OTHER PUBLICATIONS

A.G. Astrakhansky, et al., "Periodichekie Avtomaty (Aperiodic Automatic Machines)," the Nauka (Science) Publishers, Moscow, 1976, pp. 157-159, with translation, 5 pages.

A. Bystrov, et al., "Self-timed and speed independent latch circuits," in Proc. 6th U.K. Timed Forum, Univ. Manchester, 1999, pp. 1-11, 11 pages.

International Search Report issued in PCT/RU2010/000279, mailed on Nov. 2, 2010, 2 pages.

Written Opinion issued in PCT/RU2010/000279, mailed on Nov. 2, 2010, 3 pages.

* cited by examiner

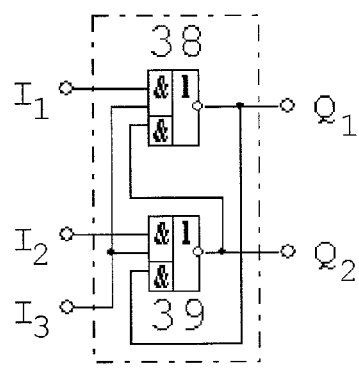
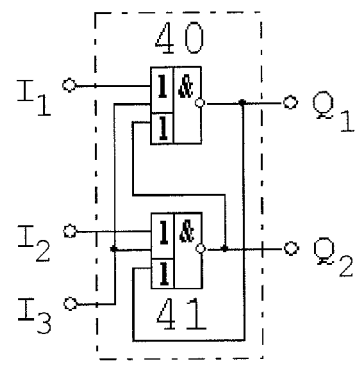
FIG.25  FIG.26
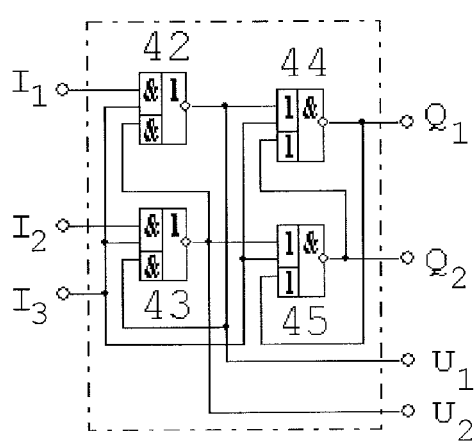
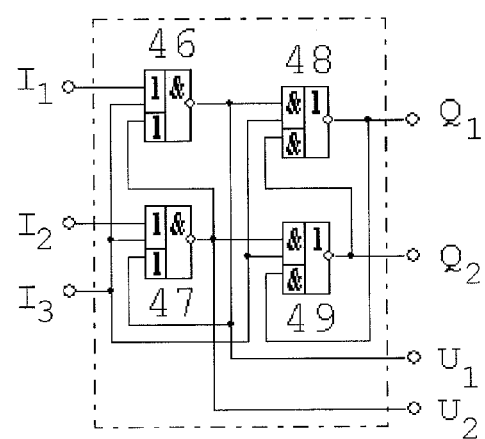
FIG.27  FIG.28

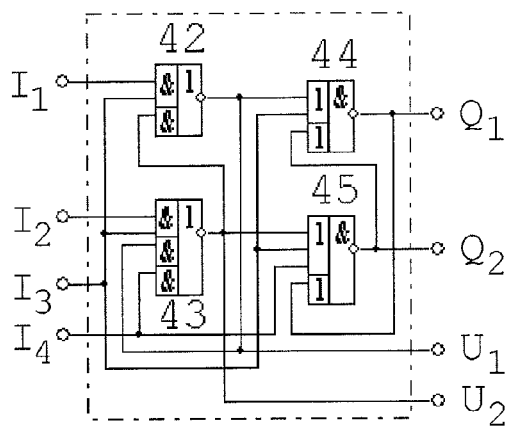 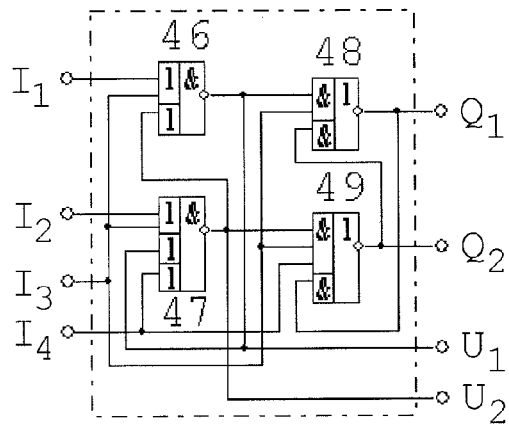
FIG.41    FIG.42
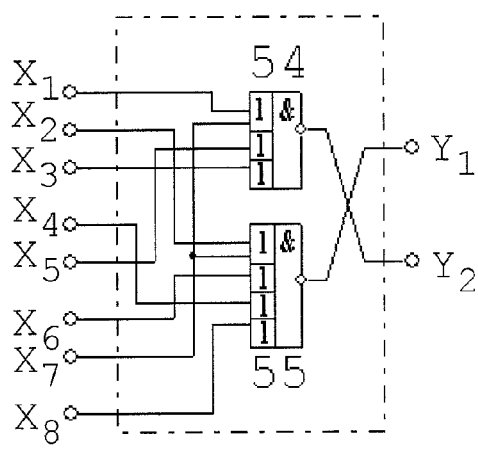 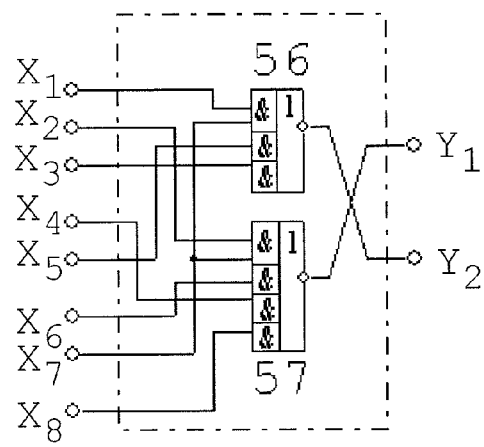
FIG.43    FIG.44

ANALYZED CIRCUIT OF THE SELF-TIMED RS-FLIP-FLOP

SIGNAL GRAPH OF OPERATION FOR THE SELF-TIMED RS-FLIP-FLOP

SELF-TIMED RS-TRIGGER WITH THE ENHANCED NOISE IMMUNITY

Self-timed RS-trigger with the enhanced noise immunity relates to pulse and computational technique and may be used for designing self-timed trigger, register and computational units, as well as in digital signal processing systems.

BACKGROUND OF THE INVENTION

There is known trigger [1] comprising two elements OR-NO.

Detriment of this trigger is an absence of means of transition termination indication.

The closest to the proposed solution by technical nature and accepted as a prior art prototype is the self-timed trigger [2] comprising storage unit, indication element, paraphase data input, write enable input (request input), reset input, first and second components of paraphase data output and indication output.

Detriment of the prior art prototype is its low noise immunity is due to its data output is formed directly by bistable cell storing trigger's state, is characterized by low output capability and is influenced by noise in signal lines of trigger's environment, which may lead to an unauthorized change of bistable cell's state.

SUMMARY OF THE INVENTION

A problem to be solved by the invention consists in enhancing noise immunity of the trigger.

This effect is achieved due to that self-timed RS-trigger comprising storage unit, indication unit, first and second components of paraphase data input, first and second components of paraphase data output and indication output, and first and second components of the paraphase data input are connected to first and second inputs of the storage unit accordingly, first component of the trigger's paraphase data output is connected to first input of the indication unit, second component of the trigger's paraphase data output is connected to second input of the indication unit, the trigger's indication output is connected to an output of the indication unit, two inverters and a preindication unit are added, first and second inputs of the preindication unit are connected to first and second components of the paraphase data input accordingly, an input of first inverter is connected to first output of the storage unit, an output of first inverter is connected to first component of the trigger's paraphase data output and to third input of the preindication unit, an input of second inverter is connected to second output of the storage unit, an output of second inverter is connected to second component of the trigger's paraphase data output and to fourth input of the preindication unit, first and second outputs of the preindication unit are connected to third and fourth inputs of the indication unit accordingly, a paraphase input with spacer (dual-rail signal) is used as the data input.

The proposed device satisfies the inventive step patentability condition. Although usage of inverters in synchronous triggers is known, however, using them in the self-timed RS-trigger together with the preindication unit, with taking into account the work specificity of the self-timed circuits and to preservation of the trigger's indicatability (observability), has provided obtaining a result expressed by the effect of invention. Essential difference of the proposed realization of the RS-trigger from similar prior art solutions in self-timed circuitry consists in the decision of a problem of preservation of the trigger's indicatability (the guaranteed tracing of the moments of the termination of all transients at switching trigger from one state into another one) after adding inverters at its paraphase data output. With added inverters RS-trigger remains to belong to class of circuits which behavior is insensitive to gate delays. Exact technical implementations of the proposed solution are described below.

So far as added construction connections do not known in analogous technical solutions, this trigger may be considered as having the inventive step.

Term "paraphase" as used therein is defined as follows. Paraphase signal is that presented by two components, namely, by a pair of variables which in a static state have inter inverted states. As a result, in a static state such signal [X, XB] can have one of two working states: [X=0, XB=1] or [X=1, XB=0].

Transition of a paraphase signal from one static working state into an opposite one can be carried out by two ways.

First way assumes using of a paraphase signal with spacer: when transition into next static working state is necessarily preceded by transition through third static state—spacer (a non-working state or passive state). If the state [1,1] is used as a spacer, then a paraphase signal is said to be the paraphase signal with unit spacer, and if a state [0,0] is used as a spacer, then a paraphase signal is said to be the paraphase signal with zero spacer. Spacer state is the static state that should be controlled in self-timed circuitry by the indicator of transient process termination, in this case—the termination of the transient into spacer state.

Second way assumes using of a paraphase signal without spacer (or simply a paraphase signal). Thus transition from one static working state into another one is carried out through a dynamic (temporary) state: [1,1] or [0,0],—named a transit state.

In this invention, a paraphase signal with spacer is used as an data input signal of the RS-trigger in variants without write enable input and a paraphase signal without spacer is used in variants where there is write enable input, and the data output of the RS-trigger is a paraphase signal without spacer.

BRIEF DESCRIPTION OF THE DRAWINGS

FIG. 25 shows a circuit of the storage unit of the self-timed RS-latch with the enhanced noise immunity having write enable input with zero spacer.

FIG. 26 presents a circuit of the storage unit of the self-timed RS-latch with the enhanced noise immunity having write enable input with unit spacer.

FIG. 27 shows a circuit of the storage unit of the self-timed RS-flip-flop with the enhanced noise immunity having write enable input with zero spacer.

FIG. 28 presents a circuit of the storage unit of the self-timed RS-flip-flop with the enhanced noise immunity having write enable input with unit spacer.

FIG. 41 shows a circuit of the storage unit of the self-timed RS-flip-flop with the enhanced noise immunity having write enable input with zero spacer and self-timed preset input.

FIG. 42 presents a circuit of the storage unit of the self-timed RS-flip-flop with the enhanced noise immunity having write enable input with unit spacer and self-timed preset input.

FIG. 43 shows a circuit of the preindication unit of the self-timed RS-flip-flop with the enhanced noise immunity having write enable input with unit spacer and self-timed preset input.

FIG. 44 presents a circuit of the preindication unit of the self-timed RS-flip-flop with the enhanced noise immunity having write enable input with zero spacer and self-timed preset input.

DETAILED DESCRIPTION OF THE PREFERRED EMBODIMENT

Figure 1:
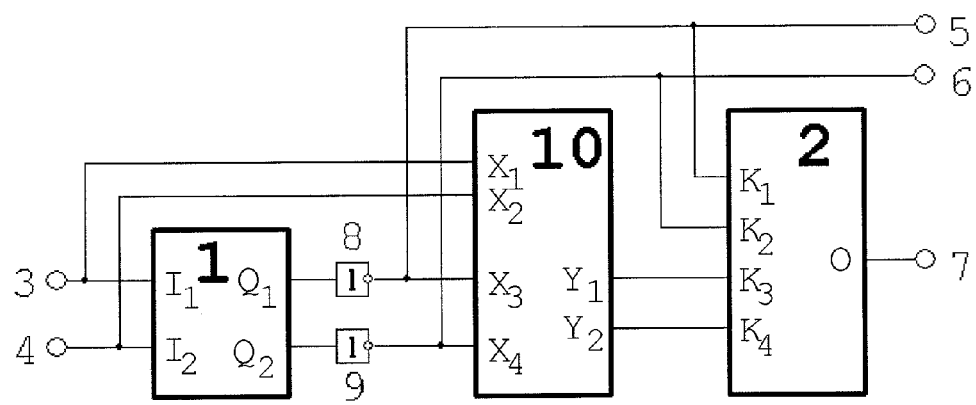
FIG. 1 presents a circuit of the self-timed RS-latch with the enhanced noise immunity.

A circuit of the self-timed RS-latch with the enhanced noise immunity is shown in FIG. 1.

The circuit consists of storage unit 1, indication unit 2, first 3 and second 4 components of paraphase data input, first 5 and second 6 components of paraphase data output, indication output 7, first 8 and second 9 inverters, preindication unit 10, first component 3 of the paraphase data input is connected to first input $I_1$ of the storage unit 1 and to first input $X_1$ of the preindication unit 10, second component 4 of the paraphase data input is connected to second input $I_2$ of the storage unit 1 and to second input $X_2$ of the preindication unit 10, first output $Q_1$ of the storage unit 1 is connected to an input of first inverter 8 whose output is connected to third input $X_3$ of the preindication unit 10, to first input $K_1$ of the indication unit 2 and to first component 5 of the paraphase data output of the trigger, second output $Q_2$ of the storage unit 1 is connected to an input of second inverter 9 whose output is connected to fourth input $X_4$ of the preindication unit 10, to second input $K_2$ of the indication unit 2 and to second component 6 of the paraphase data output of the trigger, first $Y_1$ and second $Y_2$ outputs of the preindication unit 10 are connected to third $K_3$ and to fourth $K_4$ inputs of the indication unit 2 accordingly, output O of the indication unit 2 is connected to the indication output 7 of the trigger.

Circuit operates as follows. Applying the working state at data input leads to writing new state into the storage unit 1 which through inverters 8 and 9 is propagated to first 5 and second 6 components of the paraphase data output of the trigger. The termination of writing new state into the trigger or its transition into a storage phase is controlled by the units of preindication 10 and indication 2. They analyze an accordance of states at the output of inverters 8-9 and paraphase input $I_1$-$I_2$ of the storage unit 1, to the corresponding value of the indication output 7 of the trigger. An explicit spacer value (00 or 11) of the data input 3-4 definitely corresponds to basis of realization of the trigger.

The peculiarities of this circuit comparing to prior art prototype are the following.

Trigger has inverters forming components of the paraphase data output. They increase output capability of the trigger's paraphase data output and provide an electric isolation of outputs of the storage unit from an external environment that leads to increasing immunity of the data stored in the trigger to an influence of noises at signal wires of a total circuit.

Thus, proposed trigger provides enhanced both output capability and noise immunity. The effect of invention is achieved.

The particular technical realization of the proposed self-timed RS-latch and its internal units depends on type of spacer state of the paraphase input: high or low level at both components of the paraphase data input provides keeping trigger's state. It influences the basis of realization of the storage and indication units and determines the specification of first and second component of the paraphase data input with spacer as well as the specification of first and second component of the paraphase data output of the trigger as it is described below.

Figure 2:
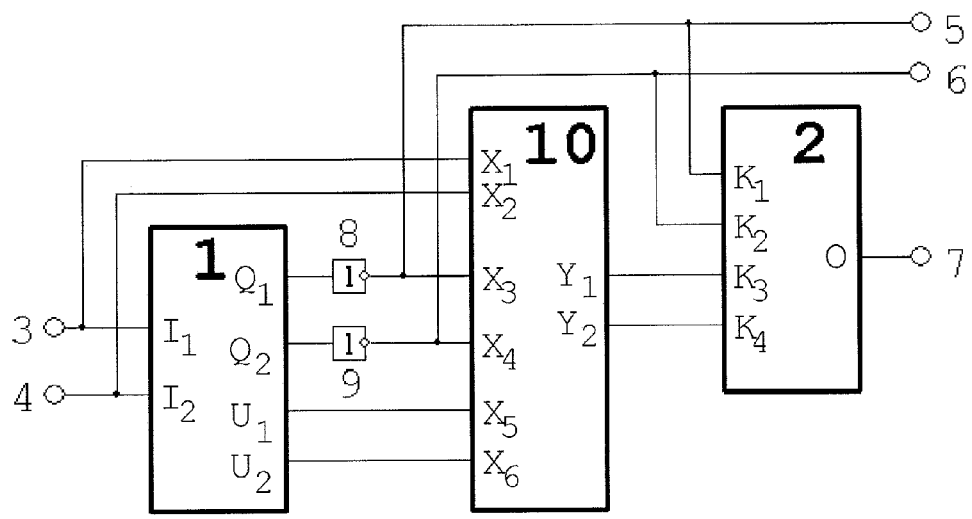
FIG. 2 demonstrates a circuit of the self-timed RS-flip-flop with the enhanced noise immunity.

FIG. 2 demonstrates a circuit of the self-timed RS-flip-flop with the enhanced noise immunity. It differs from the circuit in FIG. 1 by that the storage unit 1 has two additional outputs $U_1$, $U_2$, being the outputs of first bistable cell of the storage unit 1, which are connected to fifth $X_5$ and sixth $X_6$ inputs of the preindication unit 10 accordingly.

The circuit of the self-timed RS-flip-flop operates as follows. Applying the working state at data input leads to writing new state into first bistable cell of the storage unit 1 with outputs $U_1$, $U_2$. Thus the state of outputs $[Q_1, Q_2]$ of the storage unit 1 and accordingly the trigger's paraphase output 5, 6 do not change. The termination of transitions of the trigger's elements is reflected by an output of the indication unit 2. After applying spacer state at the input 3, 4 the state of first bistable cell of the storage unit 1 is transferred into its second bistable cell and through inverters 8 and 9 is propagated to the trigger's paraphase output 5, 6. Upon termination of transition of all trigger's elements the indication unit 2 and accordingly the indication output 7 of the trigger are switched to an opposite state (inverse with respect to the original state, corresponding to a storage phase in first bistable cell of the storage unit 1).

Figure 3:
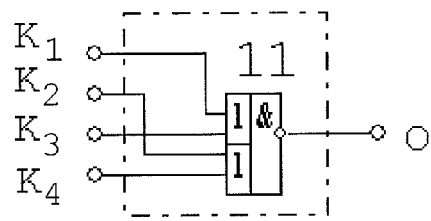
FIG. 3 presents a circuit of the indication unit for all types of the self-timed RS-latch with the enhanced noise immunity having paraphase data input with zero spacer, and for all types of the self-timed RS-flip-flop with the enhanced noise immunity having paraphase data input with unit spacer.

FIG. 3 presents a circuit of the indication unit for all types of the self-timed RS-latch with the enhanced noise immunity having paraphase data input with zero spacer, and for all types of the self-timed RS-flip-flop with the enhanced noise immunity having paraphase data input with unit spacer. It consists of OR-AND-NO element 11, whose first and second inputs of first OR input group are connected to first $K_1$ and third $K_3$ inputs of the indication unit accordingly, first and second inputs of second OR input group of OR-AND-NO element are connected to second $K_2$ and fourth $K_4$ inputs of the indication unit accordingly, an output of OR-AND-NO element is connected to the output O of the indication unit.

Figure 4:
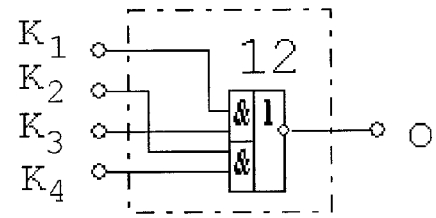
FIG. 4 demonstrates a circuit of the indication unit for all types of the self-timed RS-latch with the enhanced noise immunity having paraphase data input with unit spacer, and for all types of the self-timed RS-flip-flop with the enhanced noise immunity having paraphase data input with zero spacer.

FIG. 4 demonstrates a circuit of the indication unit for all types of the self-timed RS-latch with the enhanced noise immunity having paraphase data input with unit spacer, and for all types of the self-timed RS-flip-flop with the enhanced noise immunity having paraphase data input with zero spacer. It consists of AND-OR-NO element 12, whose first and second inputs of first AND input group are connected to first $K_1$ and third $K_3$ inputs of the indication unit respectively, first and second inputs of second AND input group are connected to second $K_2$ and fourth $K_4$ inputs of the indication unit respectively, an output of AND-OR-NO element 12 is connected to the output O of the indication unit.

Figure 5:
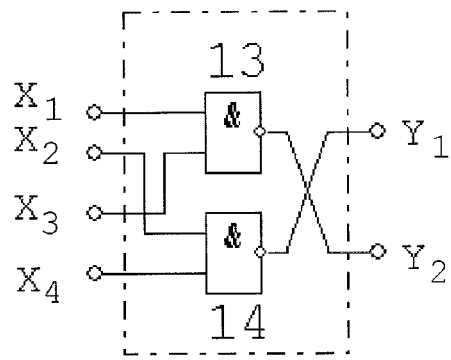
FIG. 5 shows a circuit of the preindication unit of the self-timed RS-latch with the enhanced noise immunity having paraphase data input with zero spacer.

FIG. 5 shows a circuit of the preindication unit 10 of the self-timed RS-latch with the enhanced noise immunity having paraphase data input with zero spacer. It consists of two AND-NO elements 13-14, first and second inputs of first AND-NO element 13 are connected to first $X_1$ and third $X_3$ inputs of the preindication unit 10 respectively, first and second inputs of second AND-NO element 14 are connected to second $X_2$ and fourth $X_4$ inputs of the preindication unit 10 respectively, outputs of second 14 and first 13 AND-NO elements are connected to first $Y_1$ and second $Y_2$ outputs of the preindication unit 10 accordingly.

Figure 6:
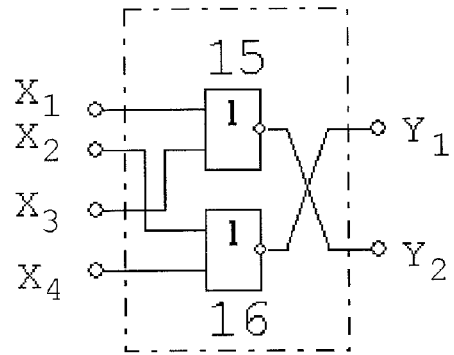
FIG. 6 presents a circuit of the preindication unit of the self-timed RS-latch with the enhanced noise immunity having paraphase data input with unit spacer.

FIG. 6 presents a circuit of the preindication unit 10 of the self-timed RS-latch with the enhanced noise immunity having paraphase data input with unit spacer. It consists of two OR-NO elements 15-16, first and second inputs of first OR-NO element 15 are connected to first $X_1$ and third $X_3$ inputs of the preindication unit 10 respectively, first and second inputs of second OR-NO element 16 are connected to second $X_2$ and fourth $X_4$ inputs of the preindication unit 10 respectively, outputs of second 16 and first 15 OR-NO elements are connected to first $Y_1$ and second $Y_2$ outputs of the preindication unit 10 accordingly.

Figure 7:
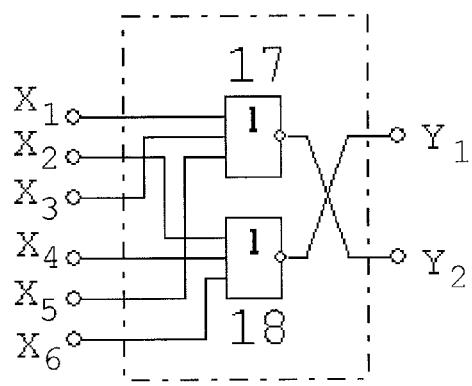
FIG. 7 demonstrates a circuit of the preindication unit of the self-timed RS-flip-flop with the enhanced noise immunity having paraphase data input with zero spacer.

FIG. 7 demonstrates a circuit of the preindication unit 10 of the self-timed RS-flip-flop with the enhanced noise immunity having paraphase data input with zero spacer. It consists of two OR-NO elements 17-18, first, second and third inputs of first OR-NO element 17 are connected to first $X_1$, third $X_3$ and fifth $X_5$ inputs of the preindication unit 10 respectively, first, second and third inputs of second OR-NO element 18 are connected to second $X_2$, fourth $X_4$ and sixth $X_6$ inputs of the preindication unit 10 respectively, outputs of second 18 and first 17 OR-NO elements are connected to first $Y_1$ and second $Y_2$ outputs of the preindication unit 10 accordingly.

Figure 8:
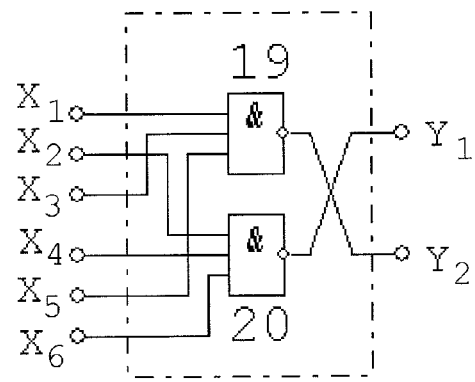
FIG. 8 presents a circuit of the preindication unit of the self-timed RS-flip-flop with the enhanced noise immunity having paraphase data input with unit spacer.

FIG. 8 presents a circuit of the preindication unit of the self-timed RS-flip-flop with the enhanced noise immunity having paraphase data input with unit spacer. It consists of two AND-NO elements 19-20, first, second and third inputs of first AND-NO element 19 are connected to first $X_1$, third $X_3$ and fifth $X_5$ inputs of the preindication unit 10 respectively, first, second and third inputs of second AND-NO element 20 are connected to second $X_2$, fourth $X_4$ and sixth $X_6$ inputs of the preindication unit 10 respectively, outputs of second 20 and first 19 AND-NO elements are connected to first $Y_1$ and second $Y_2$ outputs of the preindication unit 10 accordingly.

Figure 9:
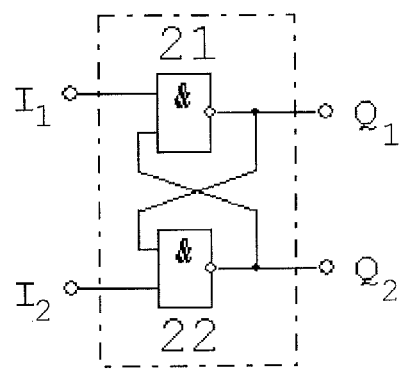
FIG. 9 demonstrates a circuit of the storage unit of the self-timed RS-latch with the enhanced noise immunity having paraphase data input with unit spacer.
Figure 10:
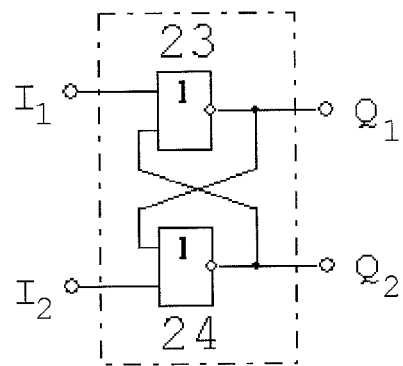
FIG. 10 shows a circuit of the storage unit of the self-timed RS-latch with the enhanced noise immunity having paraphase data input with zero spacer.

Traditionally a storage unit of the self-timed RS-latches is realized by one bistable cell, whose outputs are the outputs both of the storage unit and the trigger. Examples of realization of the storage unit of the RS-latch with a paraphase data input with unit and zero spacer are shown in FIGS. 9 and 10 accordingly. They are identical to the RS-trigger circuits in FIG. 2.2(*a*) and FIG. 2.2 (*6*) in [3].

The circuit of the storage unit 1 of the self-timed RS-latch with the enhanced noise immunity having paraphase data input with unit spacer (FIG. 9) consists of two AND-NO elements 21-22, first and second inputs of first AND-NO element 21 are connected to first input $I_1$ and second output $Q_2$ of the storage unit respectively, first and second inputs of second AND-NO element 22 are connected to first output $Q_1$ and second input $I_2$ of the storage unit respectively, outputs of first 21 and second 22 AND-NO elements are connected to first $Q_1$ and second $Q_2$ outputs of the storage unit accordingly.

The circuit of the storage unit of the self-timed RS-latch with the enhanced noise immunity having paraphase data input with zero spacer (FIG. 10) consists of two OR-NO elements 23-24, first and second inputs of first OR-NO element 23 are connected to first input $I_1$ and second output $Q_2$ of the storage unit respectively, first and second inputs of second OR-NO element 24 are connected to first output $Q_1$ and second input $I_2$ of the storage unit respectively, outputs of first 23 and second 24 OR-NO elements are connected to first $Q_1$ and to second $Q_2$ outputs of the storage unit accordingly.

Figure 11:
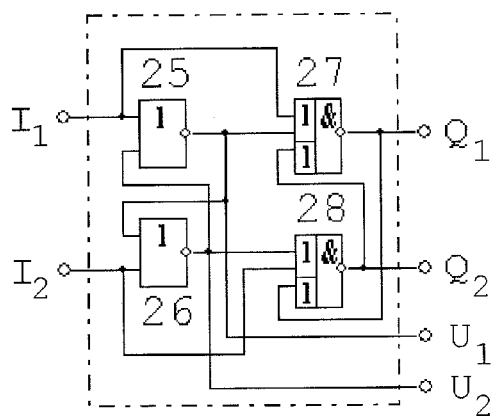
FIG. 11 presents a circuit of the storage unit of the self-timed RS-flip-flop with the enhanced noise immunity having paraphase data input with zero spacer.
Figure 12:
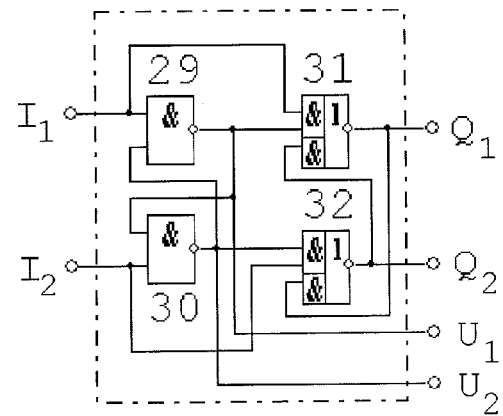
FIG. 12 demonstrates a circuit of the storage unit of the self-timed RS-flip-flop with the enhanced noise immunity having paraphase data input with unit spacer.

The storage unit 1 of the self-timed RS-flip-flop traditionally consists of two bistable cells in-series. The circuits of the storage unit of the self-timed RS-flip-flop for the paraphase data input with zero and unit spacers are shown in FIGS. 11 and 12 accordingly.

The circuit of the storage unit of the self-timed RS-flip-flop with the enhanced noise immunity having paraphase data input with zero spacer (FIG. 11) consists of two OR-NO elements 25-26 and two OR-AND-NO elements 27-28, first input of first OR-NO element 25 is connected to first input $I_1$ of the storage unit and to first input of first OR input group of first OR-AND-NO element 27, an output of first OR-NO element 25 is connected to first input of second OR-NO element 26, to second input of first OR input group of first OR-AND-NO element 27 and to third output of the storage unit $U_1$, second input of second OR-NO element 26 is connected to second input $I_2$ of the storage unit and to second input of first OR input group of second OR-AND-NO element 28, an output of second OR-NO element 26 is connected to second input of first OR-NO element 25, first input of first OR input group of second OR-AND-NO element 28 and to fourth output $U_2$ of the storage unit, an output of first OR-AND-NO element 27 is connected to an input of second OR input group of second OR-AND-NO element 28 and to first output of the storage unit $Q_1$, an output of second OR-AND-NO element 28 is connected to an input of second OR input group of first OR-AND-NO element 27 and to second output of the storage unit $Q_2$.

The circuit of the storage unit 1 of the self-timed RS-flip-flop with the enhanced noise immunity having paraphase data input with unit spacer (FIG. 12) consists of two AND-NO elements 29-30 and two AND-OR-NO elements 31-32, first input of first AND-NO element 29 is connected to first input $I_1$ of the storage unit and to first input of first AND input group of first AND-OR-NO element 31, an output of first AND-NO element 29 is connected to first input of second AND-NO element 30, to second input of first AND input group of first AND-OR-NO element 31 and to third output of the storage unit $U_1$, second input of second AND-NO element 30 is connected to second input $I_2$ of the storage unit and to second input of first AND input group of second AND-OR-NO element 32, an output of second AND-NO element 30 is connected to second input of first AND-NO element 29, to first input of first AND input group of second AND-OR-NO element 32 and to fourth output $U_2$ of the storage unit, an output of first AND-OR-NO element 31 is connected to an input of second AND input group of second AND-OR-NO element 32 and to first output of the storage unit $Q_1$, an output of second AND-OR-NO element 32 is connected to an input of second AND input group of first AND-OR-NO element 31 and to second output of the storage unit $Q_2$.

The storage unit can have additional synchronous reset and set inputs (preset terminals) which do not require indication. They do not influence realization of the preindication and indication units.

However in practice it is often required to control a preset termination of both trigger and whole circuit. In this case it is necessary to use self-timed reset or set.

Figure 13:
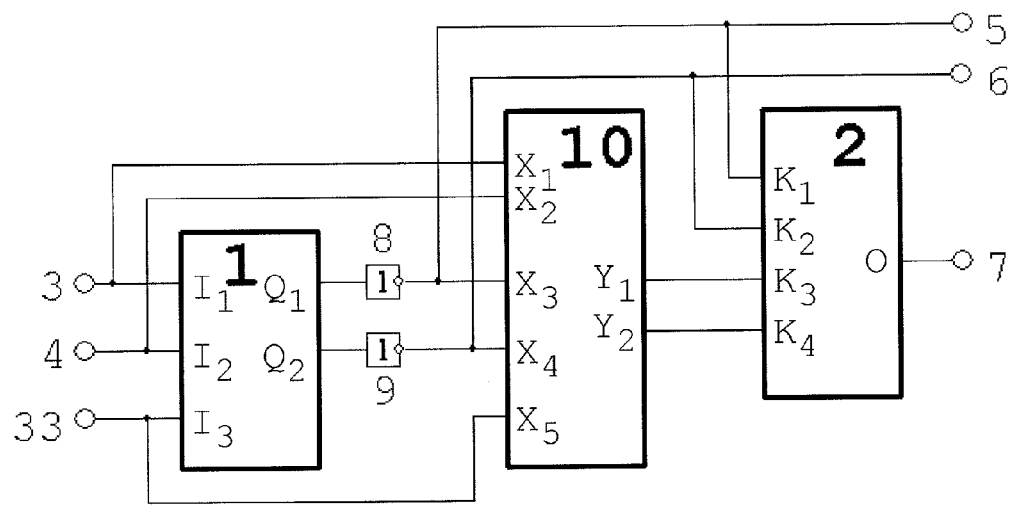
FIG. 13 presents a circuit of the self-timed RS-latch with the enhanced noise immunity having paraphase data input and self-timed preset input (reset or set terminal).

FIG. 13 presents a circuit of the self-timed RS-latch with the enhanced noise immunity having paraphase data input and self-timed preset input (reset or set terminal). It differs from the circuit in FIG. 1 by presence of preset input 33 connected to third input $I_3$ of the storage unit 1 and to fifth input $X_5$ of the preindication unit 10.

Figure 14:
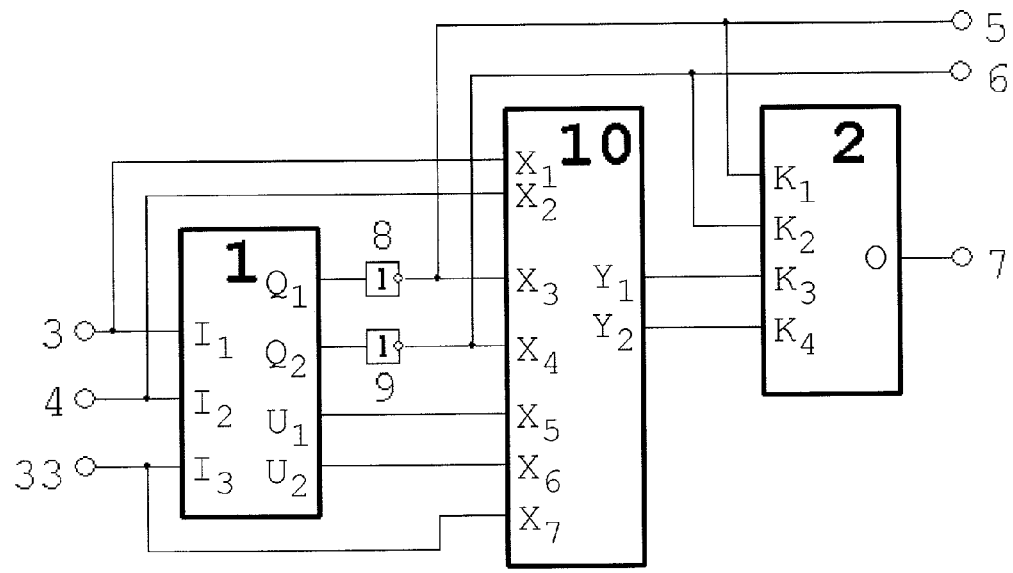
FIG. 14 demonstrates a circuit of the self-timed RS-flip-flop with the enhanced noise immunity having paraphase data input and self-timed preset input (reset or set terminal).

FIG. 14 demonstrates a circuit of the self-timed RS-flip-flop with the enhanced noise immunity having paraphase data input and self-timed preset input (reset or set terminal). It differs from the circuit in FIG. 2 by presence of preset input 33 connected to third input $I_3$ of the storage unit 1 and to seventh input $X_7$ of the preindication unit 10.

The preset is carried out at spacer state at the paraphase data input by applying to preset input a level that is an opposite to spacer state of the paraphase input. The storage unit of the self-timed RS-latch is realized identically for synchronous and self-timed presets.

Figure 15:
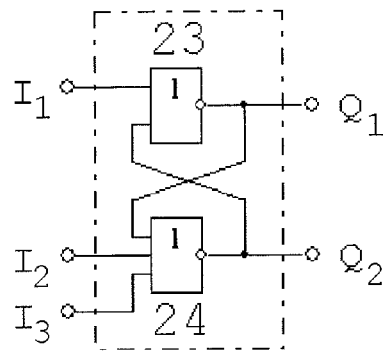
FIG. 15 shows a circuit of the storage unit of the self-timed RS-latch with the enhanced noise immunity having paraphase data input with zero spacer and preset input.

FIG. 15 shows a circuit of the storage unit 1 of the self-timed RS-latch with the enhanced noise immunity having paraphase data input with zero spacer and preset input. It differs from the circuit in FIG. 10 by that third input of the storage unit $I_3$, being the preset input, and third input of second OR-NO element 24 are added being connected to each other.

Let the paraphase input $I_1$, $I_2$ of the storage unit be in spacer ($I_1=I_2=0$) and bistable cell on base of elements 23 and 24 stores state [$Q_1=0$, $Q_2=1$]. Applying high level, which is opposite to the input spacer, to preset input, $I_3=1$, sets bistable cell into state [$Q_1=1$, $Q_2=0$], that is opposite to an initial one.

Figure 16:
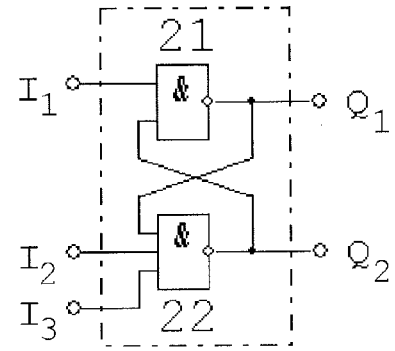
FIG. 16 presents a circuit of the storage unit of the self-timed RS-latch with the enhanced noise immunity having paraphase data input with unit spacer and preset input.

FIG. 16 presents a circuit of the storage unit 1 of the self-timed RS-latch with the enhanced noise immunity having paraphase data input with unit spacer and preset input. It differs from the circuit in FIG. 9 by that third input of the storage unit $I_3$, being a preset input, and third input of second AND-NO element 22 are added being connected to each other.

Let the paraphase input $I_1$, $I_2$ of the storage unit be in spacer ($I_1=I_2=1$) and bistable cell on base of elements 21 and 22 stores state [$Q_1=1$, $Q_2=0$]. Applying low level, which is opposite to the input spacer, to preset input, $I_3=0$, sets bistable cell into state [$Q_1=0$, $Q_2=1$], that is opposite to an initial one.

In self-timed RS-flip-flop, storage unit with synchronous and self-timed preset is realized by various circuits.

Figure 17:
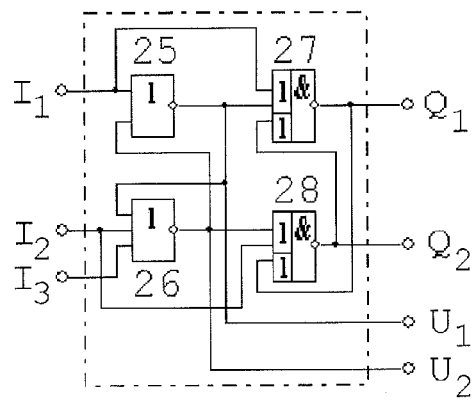
FIG. 17 shows a circuit of the storage unit of the self-timed RS-flip-flop with the enhanced noise immunity having paraphase data input with zero spacer and synchronous preset input.

FIG. 17 shows a circuit of the storage unit 1 of the self-timed RS-flip-flop with the enhanced noise immunity having paraphase data input with zero spacer and synchronous preset input. It differs from the circuit in FIG. 11 by that third input $I_3$ of the storage unit, being the trigger's synchronous preset input, and third input of second OR-NO element 26 are added being connected to each other.

Figure 18:
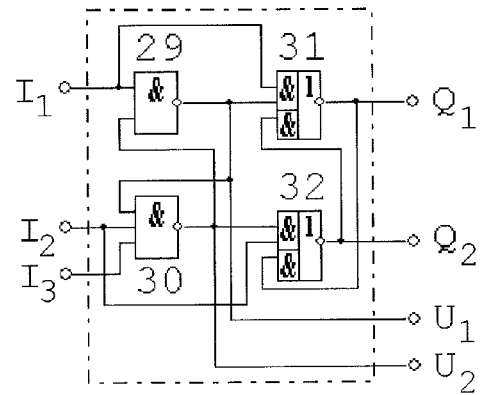
FIG. 18 demonstrates a circuit of the storage unit of the self-timed RS-flip-flop with the enhanced noise immunity having paraphase data input with unit spacer and synchronous preset input.

FIG. 18 demonstrates a circuit of the storage unit 1 of the self-timed RS-flip-flop with the enhanced noise immunity having paraphase data input with unit spacer and synchronous preset input. It differs from the circuit in FIG. 12 by that third input $I_3$ of the storage unit, being the trigger's synchronous preset input, and third input of second AND-NO element 30 are added being connected with each other.

Figure 19:
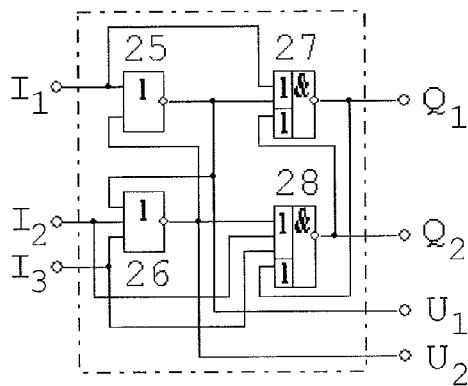
FIG. 19 shows a circuit of the storage unit of the self-timed RS-flip-flop with the enhanced noise immunity having paraphase data input with zero spacer and self-timed preset input.

FIG. 19 shows a circuit of the storage unit 1 of the self-timed RS-flip-flop with the enhanced noise immunity having paraphase data input with zero spacer and self-timed preset input. It differs from the circuit in FIG. 17 by that third input is added into first OR input group of second OR-AND-NO element 28 being connected to third input $I_3$ of the storage unit.

Figure 20:
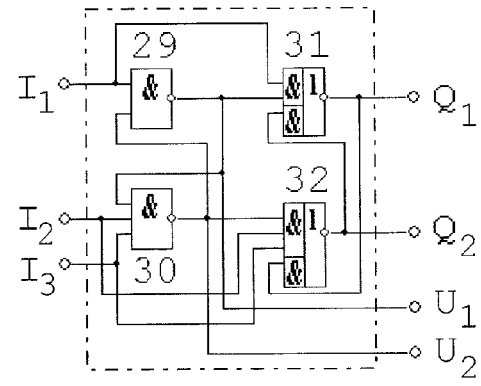
FIG. 20 demonstrates a circuit of the storage unit of the self-timed RS-flip-flop with the enhanced noise immunity having paraphase data input with unit spacer and self-timed preset input.

FIG. 20 demonstrates a circuit of the storage unit 1 of the self-timed RS-flip-flop with the enhanced noise immunity having paraphase data input with unit spacer and self-timed preset input. It differs from the circuit in FIG. 18 by that third input is added into first AND input group of second AND-OR-NO element 32 being connected to third input $I_3$ of the storage unit.

For the self-timed RS-triggers with the enhanced noise immunity with synchronous preset, preindication and indication units are used the same, as for the self-timed RS-trigger without preset. In the RS-triggers with self-timed preset, the preindication unit becomes complicated.

Figure 21:
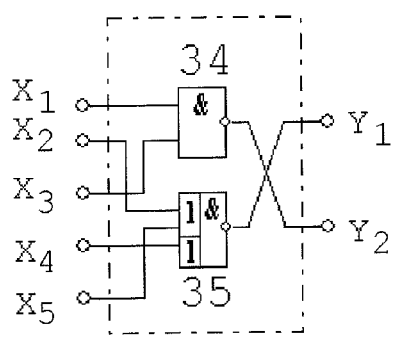
FIG. 21 shows a circuit of the preindication unit of the self-timed RS-latch with the enhanced noise immunity having paraphase data input with zero spacer and self-timed preset input.

FIG. 21 shows a circuit of the preindication unit of the self-timed RS-latch with the enhanced noise immunity having paraphase data input with zero spacer and self-timed preset input. The circuit consists of AND-NO element 34 and OR-AND-NO element 35, first and second inputs of AND-NO element 34 are connected to first $X_1$ and third $X_3$ inputs of the preindication unit respectively, an output of AND-NO element 34 is connected to second output $Y_2$ of the preindication unit, first and second inputs of first OR input group of OR-AND-NO element 35 are connected to second $X_2$ and fifth $X_5$ inputs of the preindication unit respectively, an input of second OR input group of OR-AND-NO element 35 is connected to fourth input $X_4$ of the preindication unit, an output of OR-AND-NO element 35 is connected to first output $Y_1$ of the preindication unit.

Figure 22:
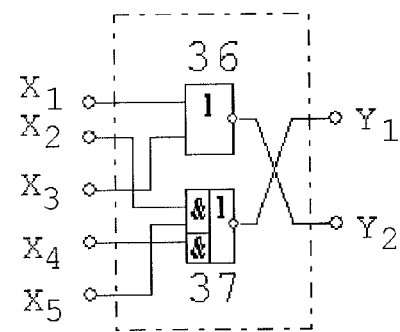
FIG. 22 presents a circuit of the preindication unit of the self-timed RS-latch with the enhanced noise immunity having paraphase data input with unit spacer and self-timed preset input.

FIG. 22 presents a circuit of the preindication unit of the self-timed RS-latch with the enhanced noise immunity having paraphase data input with unit spacer and self-timed preset input. The circuit consists of OR-NO element 36 and AND-OR-NO element 37, first and second inputs of OR-NO element 36 are connected to first $X_1$ and third $X_3$ inputs of the preindication unit respectively, an output of OR-NO element 36 is connected to second output $Y_2$ of the preindication unit, first and second inputs of first AND input group of AND-OR-NO element 37 are connected to second $X_2$ and fifth $X_5$ inputs of the preindication unit respectively, an input of second AND input group of AND-OR-NO element 37 is connected to fourth input $X_4$ of the preindication unit, the output of AND-OR-NO element 37 is connected to first output $Y_1$ of the preindication unit.

Figure 23:
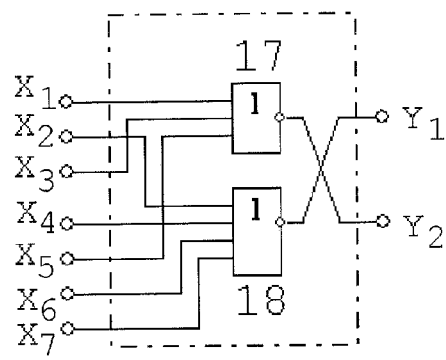
FIG. 23 shows a circuit of the preindication unit of the self-timed RS-flip-flop with the enhanced noise immunity having paraphase data input with zero spacer and self-timed preset input.

FIG. 23 shows a circuit of the preindication unit of the self-timed RS-flip-flop with the enhanced noise immunity having paraphase data input with zero spacer and self-timed preset input. The circuit differs from the circuit in FIG. 7 by that seventh input $X_7$ is added to the preindication unit, and fourth input is added to second OR-NO element 18 being connected to seventh input $X_7$ of the preindication unit.

Figure 24:
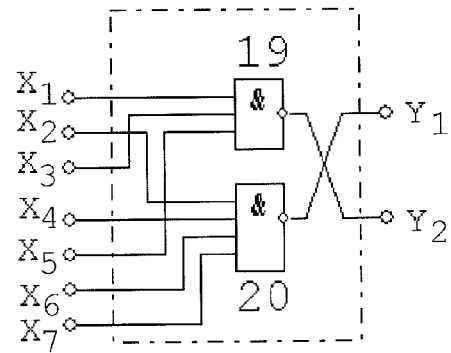
FIG. 24 presents a circuit of the preindication unit of the self-timed RS-flip-flop with the enhanced noise immunity having paraphase data input with unit spacer and self-timed preset input.

FIG. 24 presents a circuit of the preindication unit of the self-timed RS-flip-flop with the enhanced noise immunity having paraphase data input with unit spacer and self-timed preset input. The circuit differs from the circuit in FIG. 8 by that seventh input $X_7$ is added to the preindication unit, and fourth input is added to second AND-NO element 20 being connected to seventh input $X_7$ of the preindication unit.

Described above block-diagrams and circuits of storage unit, preindication unit and indication one cover various variants of realization of the self-timed RS-trigger with the enhanced noise immunity having the paraphase data input with spacer depending on the trigger's input specification. Table 1 represents the combinations of units of the self-timed RS-trigger with the paraphase data input with spacer, and specifications of the input and output terminals, forming exact realizations of the trigger.

The considered variants of the self-timed RS-trigger realization are characterized by that data input has spacer that allows for organizing control of the trigger, i.e. transferring it into a phase of updating of data output state or into a phase of keeping this state only by means of changing state of the data input.

In practice, however, the paraphase signal without spacer is often used as the trigger's data input. It has only two statically steady states where two components of this signal have complementary values. In this case, an additional signal named a control signal or a write enable signal is required for successful controlling trigger. It is the single-rail signal having spacer and work (active) state. Spacer value of this input causes storing current state of the paraphase data output of the self-timed RS-latch, while the self-timed RS-flip-flop copies a state from input bistable cell to an output one, updating a state of its paraphase data output.

The circuit of the self-timed RS-latch with the enhanced noise immunity having write enable input is identical to the circuit in FIG. 13. A difference between them consists only in that the input 33 operates as write enable input, instead of self-timed preset input.

The circuit of the self-timed RS-flip-flop with the enhanced noise immunity having write enable input is identical to the circuit in FIG. 14. A difference between them consists only in that the input 33 operates as write enable input, instead of self-timed preset input.

TABLE 1

Variants of self-timed RS-trigger with the paraphase data input with spacer

| No No pp. | Type of self-timed RS-trigger | Input 3 | Input 4 | Storage unit | Preindication unit | Indication unit | Output 5 | Output 6 |
|---|---|---|---|---|---|---|---|---|
| 1 | Latch with zero input spacer | R | S | FIG. 10 | FIG. 5 | FIG. 3 | QB | Q |
| 2 | Latch with unit input spacer | R | S | FIG. 9 | FIG. 6 | FIG. 4 | Q | QB |
| 3 | Latch with zero input spacer having synchronous reset input | S | R | FIG. 15 | FIG. 5 | FIG. 3 | Q | QB |
| 4 | Latch with zero input spacer having synchronous set input | R | S | FIG. 15 | FIG. 5 | FIG. 3 | QB | Q |
| 5 | Latch with unit input spacer having synchronous reset input | S | R | FIG. 16 | FIG. 6 | FIG. 4 | QB | Q |
| 6 | Latch with unit input spacer having synchronous set input | R | S | FIG. 16 | FIG. 6 | FIG. 4 | Q | QB |
| 7 | Latch with zero input spacer having self-timed reset input | S | R | FIG. 15 | FIG. 21 | FIG. 3 | Q | QB |
| 8 | Latch with zero input spacer having self-timed set input | R | S | FIG. 15 | FIG. 21 | FIG. 3 | QB | Q |
| 9 | Latch with unit input spacer having self-timed reset input | S | R | FIG. 16 | FIG. 22 | FIG. 4 | QB | Q |
| 10 | Latch with unit input spacer having self-timed set input | R | S | FIG. 16 | FIG. 22 | FIG. 4 | Q | QB |
| 11 | Flip-flop with zero input spacer | R | S | FIG. 11 | FIG. 7 | FIG. 4 | Q | QB |
| 12 | Flip-flop with zero input spacer | R | S | FIG. 12 | FIG. 8 | FIG. 3 | QB | Q |
| 13 | Flip-flop with zero input spacer having synchronous reset input | S | R | FIG. 17 | FIG. 7 | FIG. 4 | QB | Q |
| 14 | Flip-flop with zero input spacer having synchronous set input | R | S | FIG. 17 | FIG. 7 | FIG. 4 | Q | QB |
| 15 | Flip-flop with unit input spacer having synchronous reset input | S | R | FIG. 18 | FIG. 8 | FIG. 3 | Q | QB |
| 16 | Flip-flop with unit input spacer having synchronous set input | R | S | FIG. 18 | FIG. 8 | FIG. 3 | QB | Q |
| 17 | Flip-flop with zero input spacer having self-timed reset input | S | R | FIG. 19 | FIG. 23 | FIG. 4 | QB | Q |
| 18 | Flip-flop with zero input spacer having self-timed set input | R | S | FIG. 19 | FIG. 23 | FIG. 4 | Q | QB |
| 19 | Flip-flop with unit input spacer having self-timed reset input | S | R | FIG. 20 | FIG. 24 | FIG. 3 | Q | QB |
| 20 | Flip-flop with unit input spacer having self-timed set input | R | S | FIG. 20 | FIG. 24 | FIG. 3 | QB | Q |

The circuit of the indication unit in the circuits of the self-timed RS-latch and RS-flip-flop with the enhanced noise immunity having the write enable input is identical to the circuit of the indication unit of analogous RS-triggers having paraphase data input with spacer whose type of spacer is the same as the type of spacer of the write enable input. It is presented in FIGS. 3 and 4.

FIG. 25 shows a circuit of the storage unit of the self-timed RS-latch with the enhanced noise immunity having write enable input with zero spacer. The circuit consists of two AND-OR-NO elements 38-39, first inputs of first AND input groups of first 38 and second 39 AND-OR-NO elements are connected to first $I_1$ and to second $I_2$ inputs of the storage unit accordingly, second inputs of first AND input groups of first 38 and second 39 AND-OR-NO elements are connected to third $I_3$ input of the storage unit, an output of first AND-OR-NO element 38 is connected to first output $Q_1$ of the storage unit and to an input of second AND input group of second AND-OR-NO element 39 whose output is connected to second output $Q_2$ of the storage unit and to an input of second AND input group of first AND-OR-NO element 38.

The circuit in FIG. 25 operates as follows. High level at input $I_3$ enables writing a state of data inputs $I_1$ and $I_2$ into the storage unit. Low level (spacer) at input $I_3$ enables keeping current state of outputs $Q_1$ and $Q_2$ of the storage unit.

FIG. 26 presents a circuit of the storage unit of the self-timed RS-latch with the enhanced noise immunity having write enable input with unit spacer. The circuit consists of two OR-AND-NO elements 40-41, first inputs of first OR input groups of first 40 and second 41 OR-AND-NO elements are connected to first $I_1$ and to second $I_2$ inputs of the storage unit accordingly, second inputs of first OR input groups of first 40 and second 41 OR-AND-NO elements are connected to third $I_3$ input of the storage unit, an output of first OR-AND-NO element 40 is connected to first output $Q_1$ of the storage unit and to an input of second OR input group of second OR-AND-NO element 41 whose output is connected to second output $Q_2$ of the storage unit and to an input of second OR input group of first OR-AND-NO element 40.

The circuit in FIG. 26 operates as follows. Low level at input $I_3$ enables writing a state of data inputs $I_1$ and $I_2$ into the storage unit. High level (spacer) at input $I_3$ enables keeping current state of outputs $Q_1$ and $Q_2$ of the storage unit.

FIG. 27 shows a circuit of the storage unit of the self-timed RS-flip-flop with the enhanced noise immunity having write enable input with zero spacer. The circuit consists of two AND-OR-NO elements 42-43 and two OR-AND-NO elements 44-45, first inputs of first AND input groups of first 42 and second 43 AND-OR-NO elements are connected to first $I_1$ and to second $I_2$ inputs of the storage unit accordingly, second inputs of first AND input groups of first 42 and second 43 AND-OR-NO elements are connected to third $I_3$ input of the storage unit and to second inputs of first OR input groups of first 44 and second 45 OR-AND-NO elements, an output of first AND-OR-NO element 42 is connected to first input of first OR input group of first OR-AND-NO element 44, to an input of second AND input group of second AND-OR-NO element 43 and to third output of the storage unit $U_1$, an output of second AND-OR-NO element 43 is connected to first input of first OR input group of second OR-AND-NO element 45, to an input of second AND input group of first AND-OR-NO element 42 and to fourth output of the storage unit $U_2$, an output of first OR-AND-NO element 44 is connected to first output $Q_1$ of the storage unit and to an input of second OR input group of second OR-AND-NO element 45 whose output is connected to second output $Q_2$ of the storage unit and to an input of second OR input group of first OR-AND-NO element 44.

The circuit in FIG. 27 operates as follows. High level at input $I_3$ of the storage unit enables writing down the data from inputs $I_1$ and $I_2$ into first bistable cell on base of elements 42 and 43. Low level (spacer) at input $I_3$ of the storage unit enables keeping state of first bistable cell and copying it to second bistable cell on base of elements 44 and 45.

FIG. 28 presents a circuit of the storage unit of the self-timed RS-flip-flop with the enhanced noise immunity having write enable input with unit spacer. The circuit consists of two OR-AND-NO elements 46-47 and two AND-OR-NO elements 48-49, first inputs of first OR input groups of first 46 and second 47 OR-AND-NO elements are connected to first $I_1$ and to second $I_2$ inputs of the storage unit accordingly, second inputs of first OR input groups of first 46 and second 47 OR-AND-NO elements are connected to third $I_3$ input of the storage unit and to second inputs of first AND input groups of first 48 and second 49 elements AND-OR-NO, an output of first OR-AND-NO element 46 is connected to first input of first AND input group of first AND-OR-NO element 48, to an input of second OR input group of second OR-AND-NO element 47 and to third output of the storage unit $U_1$, an output of second OR-AND-NO element 47 is connected to first input of first AND input group of second AND-OR-NO element 49, to an input of second OR input group of first OR-AND-NO element 46 and to fourth output of the storage unit $U_2$, an output of first AND-OR-NO element 48 is connected to first output $Q_1$ of the storage unit and to an input of second AND input group of second AND-OR-NO element 49 whose output is connected to second output $Q_2$ of the storage unit and to an input of second AND input group of first AND-OR-NO element 48.

The circuit in FIG. 28 operates as follows. Low level at input $I_3$ of the storage unit enables writing down the data from inputs $I_1$ and $I_2$ into first bistable cell on base of elements 46 and 47. High level (spacer) at input $I_3$ of the storage unit enables keeping state of first bistable cell and copying it to second bistable cell on base of elements 48 and 49.

Figure 29:
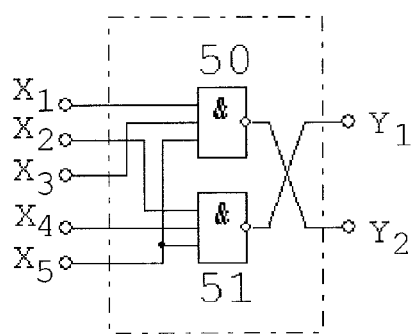
FIG. 29 shows a circuit of the preindication unit of the self-timed RS-latch with the enhanced noise immunity having write enable input with zero spacer.

FIG. 29 shows a circuit of the preindication unit of the self-timed RS-latch with the enhanced noise immunity having write enable input with zero spacer. The circuit consists of two AND-NO elements 50-51, first inputs of first 50 and second 51 AND-NO elements are connected to first $X_1$ and second $X_2$ inputs of the preindication unit accordingly, second inputs of first 50 and second 51 AND-NO elements are connected to third $X_3$ and fourth $X_4$ inputs of the preindication unit accordingly, third inputs of first 50 and second 51 AND-NO elements are connected to fifth input $X_5$ of the preindication unit, outputs of first 50 and second 51 AND-NO elements are connected to second $Y_2$ and first $Y_1$ outputs of the preindication unit accordingly.

Figure 30:
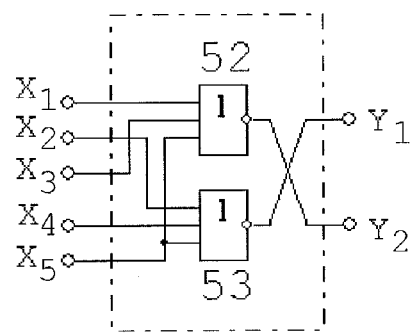
FIG. 30 presents a circuit of the preindication unit of the self-timed RS-latch with the enhanced noise immunity having write enable input with unit spacer.

FIG. 30 presents a circuit of the preindication unit of the self-timed RS-latch with the enhanced noise immunity having write enable input with unit spacer. The circuit consists of two OR-NO elements 52-53, first inputs of first 52 and second 53 OR-NO elements are connected to first $X_1$ and second $X_2$ inputs of the preindication unit accordingly, second inputs of first 52 and second 53 OR-NO elements are connected to third $X_3$ and fourth $X_4$ inputs of the preindication unit accordingly, third inputs of first 52 and second 53 OR-NO elements are connected to fifth input $X_5$ of the preindication unit, outputs of first 52 and second 53 OR-NO elements are connected to second $Y_2$ and first $Y_1$ outputs of the preindication unit accordingly.

Figure 31:
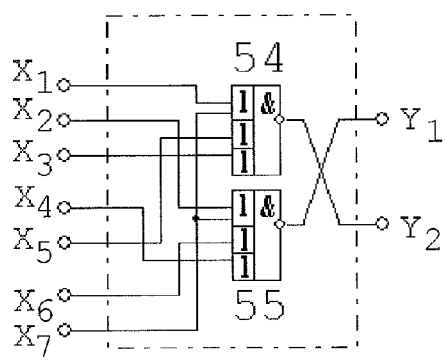
FIG. 31 shows a circuit of the preindication unit of the self-timed RS-flip-flop with the enhanced noise immunity having write enable input with unit spacer.

FIG. 31 shows a circuit of the preindication unit of the self-timed RS-flip-flop with the enhanced noise immunity having write enable input with unit spacer. The circuit consists of two OR-AND-NO elements 54-55, first inputs of first OR input groups of first 54 and second 55 OR-AND-NO elements are connected to first $X_1$ and second $X_2$ inputs of the preindication unit accordingly, second inputs of first OR input groups of first 54 and second 55 OR-AND-NO elements are connected to seventh input of the preindication unit $X_7$, inputs of second OR input groups of first 54 and second 55 OR-AND-NO elements are connected to fifth $X_5$ and sixth $X_6$ inputs of the preindication unit accordingly, inputs of third OR input groups of first 54 and second 55 OR-AND-NO elements are connected to third $X_3$ and fourth $X_4$ inputs of the preindication unit accordingly, outputs of first 54 and second 55 OR-AND-NO elements are connected to second $Y_2$ and first $Y_1$ outputs of the preindication unit accordingly.

Figure 32:
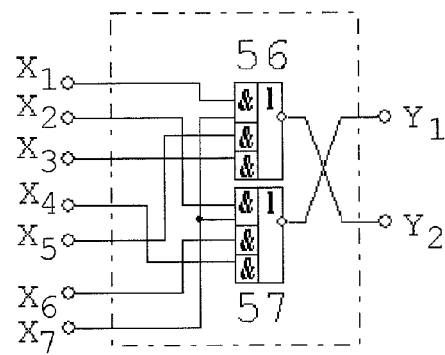
FIG. 32 presents a circuit of the preindication unit of the self-timed RS-flip-flop with the enhanced noise immunity having write enable input with zero spacer.

FIG. 32 presents a circuit of the preindication unit of the self-timed RS-flip-flop with the enhanced noise immunity having write enable input with zero spacer. The circuit consists of two AND-OR-NO elements 56-57, first inputs of first AND input groups of first 56 and second 57 AND-OR-NO elements are connected to first $X_1$ and second $X_2$ inputs of the preindication unit accordingly, second inputs of first AND input groups of first 56 and second 57 AND-OR-NO elements are connected to seventh input of the preindication unit $X_7$, inputs of second AND input groups of first 56 and second 57 AND-OR-NO elements are connected to fifth $X_5$ and sixth $X_6$ inputs of the preindication unit accordingly, inputs of third AND input groups of first 56 and second 57 AND-OR-NO elements are connected to third $X_3$ and fourth $X_4$ inputs of the preindication unit accordingly, outputs of first 56 and second 57 AND-OR-NO elements are connected to second $Y_2$ and first $Y_1$ outputs of the preindication unit accordingly.

The storage unit of the self-timed RS-trigger with the enhanced noise immunity having write enable input can have additional inputs for synchronous resetting and setting which do not require indication. They do not influence a realization of the preindication and indication units.

However, in practice it is often required to control the termination of presetting both trigger and whole circuit. In this case one needs to use self-timed reset and set inputs.

Figure 33:
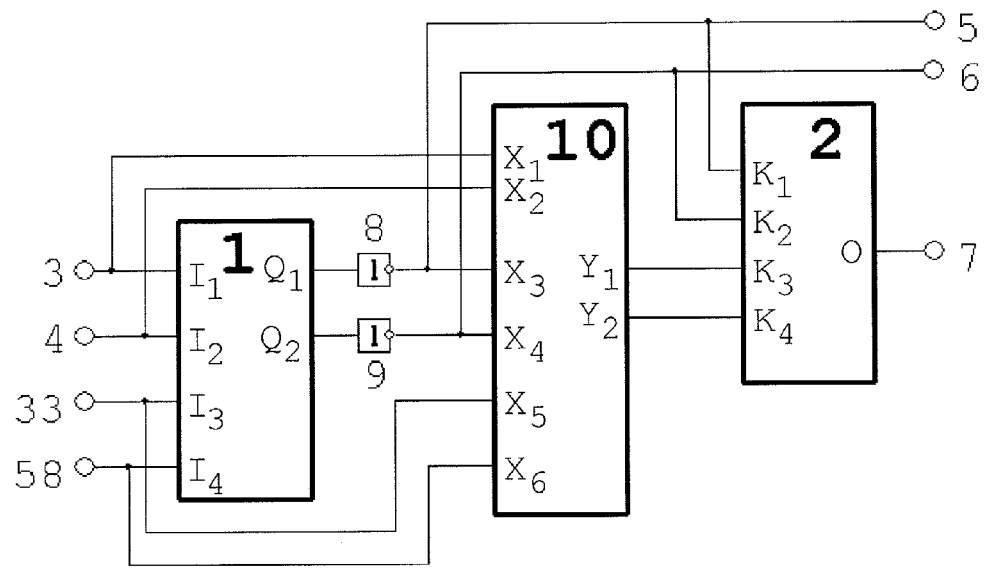
FIG. 33 presents a circuit of the self-timed RS-latch with the enhanced noise immunity having write enable input and self-timed preset input (reset or set terminal).

FIG. 33 presents a circuit of the self-timed RS-latch with the enhanced noise immunity having write enable input and self-timed preset input (reset or set terminal). It differs from the circuit in FIG. 1 by that there are a write enable input 33 connected to third input $I_3$ of the storage unit 1 and to fifth input $X_5$ of the preindication unit 10, and preset input 58 connected to fourth input $I_4$ of the storage unit 1 and to sixth input $X_6$ of the preindication unit 10.

Figure 34:
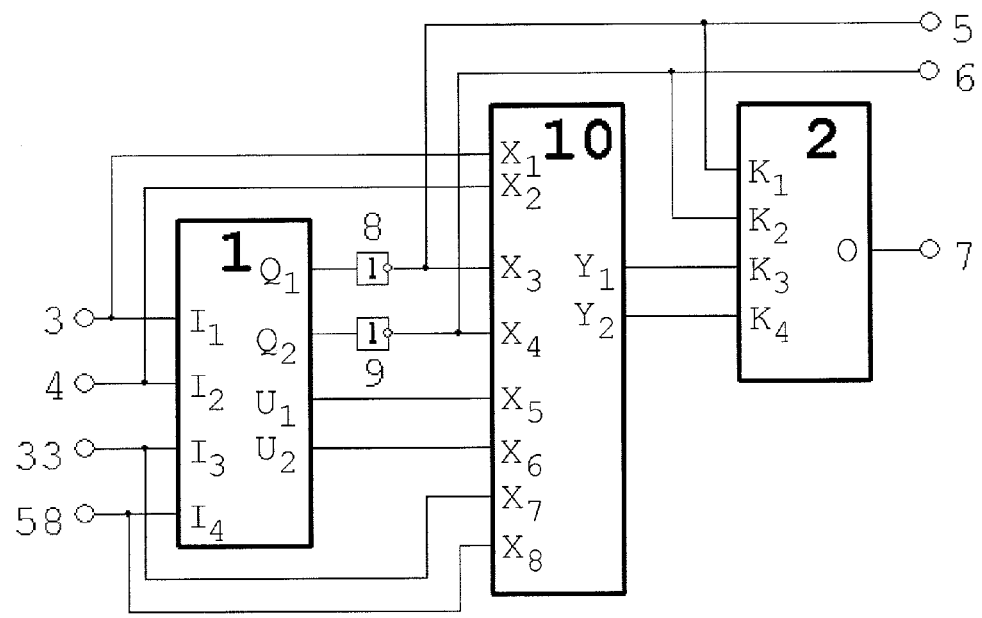
FIG. 34 shows a circuit of the self-timed RS-flip-flop with the enhanced noise immunity having write enable input and self-timed preset input (reset or set terminal).

FIG. 34 shows a circuit of the self-timed RS-flip-flop with the enhanced noise immunity having write enable input and self-timed preset input (reset or set terminal). It differs from the circuit in FIG. 2 by that there are a write enable input 33 connected to third input $I_3$ of the storage unit 1 and to seventh input $X_7$ of the preindication unit 10, and preset input 58 connected to fourth input $I_4$ of the storage unit 1 and to eighth input $X_8$ of the preindication unit 10.

Figure 35:
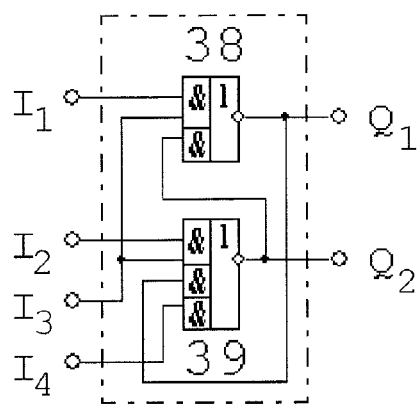
FIG. 35 presents a circuit of the storage unit of the self-timed RS-latch with the enhanced noise immunity having write enable input with zero spacer and preset input.

FIG. 35 presents a circuit of the storage unit of the self-timed RS-latch with the enhanced noise immunity having write enable input with zero spacer and preset input. The circuit differs from the circuit in FIG. 25 by that fourth input $I_4$ is added into the storage unit, and third AND input group is added into second AND-OR-NO element 39, and an input of this AND input group is connected to fourth input $I_4$ of the storage unit.

The preset is carried out at low level (spacer) at write enable input $I_3$ of the storage unit by applying high level to the preset input $I_4$.

Figure 36:
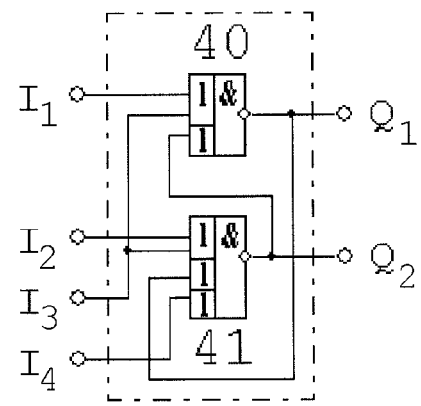
FIG. 36 presents a circuit of the storage unit of the self-timed RS-latch with the enhanced noise immunity having write enable input with unit spacer and preset input.

FIG. 36 presents a circuit of the storage unit of the self-timed RS-latch with the enhanced noise immunity having write enable input with unit spacer and preset input. The circuit differs from the circuit on FIG. 26 by that fourth input $I_4$ is added into the storage unit, and third OR input group is added into second OR-AND-NO element 41, and an input of this OR input group is connected to fourth input $I_4$ of the storage unit.

The preset is carried out at high level (spacer) at write enable input $I_3$ of the storage unit by applying low level to the preset input $I_4$.

In the self-timed RS-latch with the enhanced noise immunity having the write enable input, the storage unit 1 is realized by the same circuit in cases of synchronous and self-timed preset. In the self-timed RS-flip-flop with the enhanced noise immunity having the write enable input, the storage unit 1 is realized by different circuits in cases of synchronous and self-timed preset. In the latter case an indication of the preset termination is required that results in some complication of the circuit of the storage unit.

Figure 37:
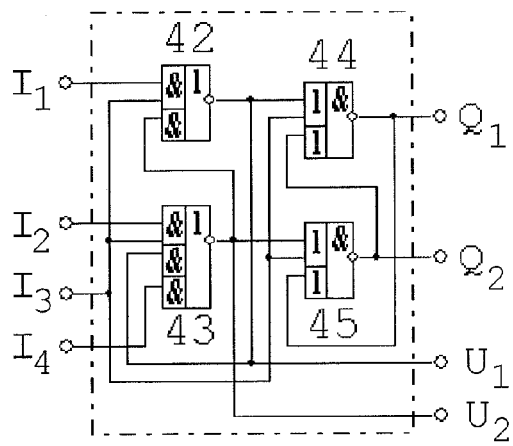
FIG. 37 shows a circuit of the storage unit of the self-timed RS-flip-flop with the enhanced noise immunity having write enable input with zero spacer and synchronous preset input.

FIG. 37 shows a circuit of the storage unit of the self-timed RS-flip-flop with the enhanced noise immunity having write enable input with zero spacer and synchronous preset input. The circuit differs from the circuit in FIG. 27 by that fourth input $I_4$ is added to the storage unit, and third AND input group is added to second AND-OR-NO element 43, and an input of this group is connected to fourth input $I_4$ of the storage unit.

The preset is carried out at low level (spacer) at write enable input $I_3$ of the storage unit by applying high level to the preset input $I_4$.

Figure 38:
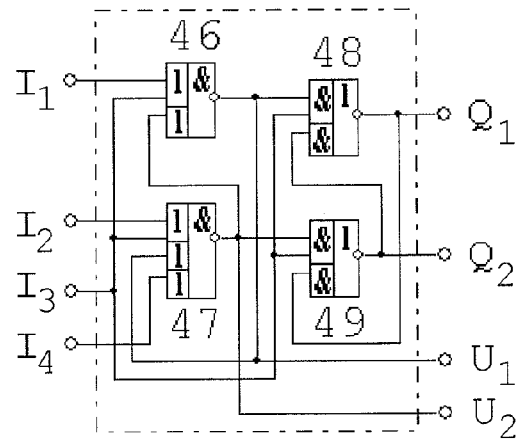
FIG. 38 presents a circuit of the storage unit of the self-timed RS-flip-flop with the enhanced noise immunity having write enable input with unit spacer and synchronous preset input.

FIG. 38 presents a circuit of the storage unit of the self-timed RS-flip-flop with the enhanced noise immunity having write enable input with unit spacer and synchronous preset input. The circuit differs from the circuit in FIG. 28 by that fourth input $I_4$ is added to the storage unit, and third OR input group is added to second OR-AND-NO element 47, and an input of this group is connected to fourth input $I_4$ of the storage unit.

The preset is carried out at high level (spacer) at write enable input $I_3$ of the storage unit by applying low level to the preset input $I_4$.

Figure 39:
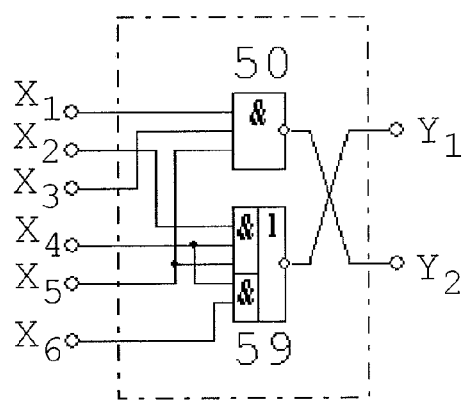
FIG. 39 shows a circuit of the preindication unit of the self-timed RS-latch with the enhanced noise immunity having write enable input with zero spacer and self-timed preset input.

FIG. 39 shows a circuit of the preindication unit of the self-timed RS-latch with the enhanced noise immunity having write enable input with zero spacer and self-timed preset input. It differs from the circuit in FIG. 29 by that second AND-NO element 51 is replaced by AND-OR-NO element 59, first, second and third inputs of first AND input group of AND-OR-NO element 59 are connected to second $X_2$, fourth $X_4$ and fifth $X_5$ inputs of the preindication unit respectively, first and second inputs of second AND input group of AND-OR-NO element 59 are connected to fourth $X_4$ and sixth $X_6$ inputs of the preindication unit respectively, and an output of the AND-OR-NO element 59 is connected to first output $Y_1$ of the preindication unit.

Figure 40:
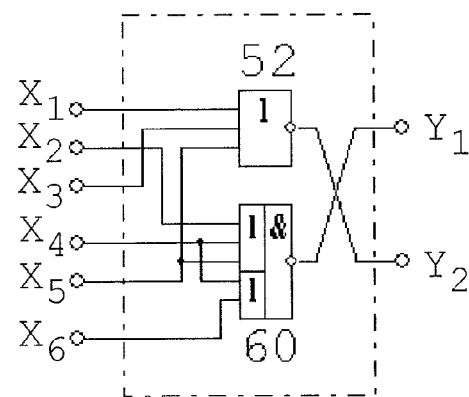
FIG. 40 presents a circuit of the preindication unit of the self-timed RS-latch with the enhanced noise immunity having write enable input with unit spacer and self-timed preset input.

FIG. 40 presents a circuit of the preindication unit of the self-timed RS-latch with the enhanced noise immunity having write enable input with unit spacer and self-timed preset input. It differs from the circuit in FIG. 30 by that second OR-NO element 53 is replaced by OR-AND-NO element 60, first, second and third inputs of first OR input group of OR-AND-NO element 60 are connected to second $X_2$, fourth $X_4$ and fifth $X_5$ inputs of the preindication unit respectively, first and second inputs of second OR input group of OR-AND-NO element 60 are connected to fourth $X_4$ and sixth $X_6$ inputs of the preindication unit respectively, and the output of OR-AND-NO element 60 is connected to first output $Y_1$ of the preindication unit.

FIG. 41 shows a circuit of the storage unit of the self-timed RS-flip-flop with the enhanced noise immunity having write enable input with zero spacer and self-timed preset input. It differs from the circuit in FIG. 37 by that third input is added to first OR input group of second OR-AND-NO element 45 being connected to fourth input of the storage unit $I_4$.

FIG. 42 presents a circuit of the storage unit of the self-timed RS-flip-flop with the enhanced noise immunity having write enable input with unit spacer and self-timed preset input. It differs from the circuit in FIG. 38 by that third input is added to first AND input group of second AND-OR-NO element 49 being connected to fourth input of the storage unit $I_4$.

FIG. 43 shows a circuit of the preindication unit of the self-timed RS-flip-flop with the enhanced noise immunity having write enable input with unit spacer and self-timed preset input. It differs from the circuit in FIG. 31 by that fourth OR input group is added to second OR-AND-NO element 55, and its input is connected to eighth $X_8$ input of the preindication unit.

FIG. 44 presents a circuit of the preindication unit of the self-timed RS-flip-flop with the enhanced noise immunity having write enable input with zero spacer and self-timed preset input. It differs from the circuit in FIG. 32 by that fourth AND input group is added to second AND-OR-NO element 57, and its input is connected to eighth $X_8$ input of the preindication unit.

Thus, described above circuit realizations of the storage, preindication and indication units together with the inverters connected as it is shown in FIGS. 13, 14, 33 and 34, allow for constructing various variants of the self-timed RS-trigger with the enhanced noise immunity having the write enable input depending on the specification of the trigger's inputs. Table 2 represents the combinations of internal units of the self-timed RS-trigger with the enhanced noise immunity having the write enable input and specifications of the input and output terminals, forming exact realizations of the trigger.

TABLE 2

Variants of self-timed RS-trigger with write enable input

| No No pp. | Type of self-timed RS-trigger | Input 3 | Input 4 | Storage unit | Preindication unit | Indication unit | Output 5 | Output 6 |
|---|---|---|---|---|---|---|---|---|
| 1 | Latch with zero spacer of write enable input | R | S | FIG. 25 | FIG. 29 | FIG. 3 | QB | Q |

TABLE 2-continued

Variants of self-timed RS-trigger with write enable input

| No No pp. | Type of self-timed RS-trigger | Input 3 | Input 4 | Storage unit | Preindication unit | Indication unit | Output 5 | Output 6 |
|---|---|---|---|---|---|---|---|---|
| 2 | Latch with unit spacer of write enable input | R | S | FIG. 26 | FIG. 30 | FIG. 4 | Q | QB |
| 3 | Latch with zero spacer of write enable input and synchronous reset input | S | R | FIG. 35 | FIG. 29 | FIG. 3 | Q | QB |
| 4 | Latch with zero spacer of write enable input and synchronous set input | R | S | FIG. 35 | FIG. 29 | FIG. 3 | QB | Q |
| 5 | Latch with unit spacer of write enable input and synchronous reset input | S | R | FIG. 36 | FIG. 30 | FIG. 4 | QB | Q |
| 6 | Latch with unit spacer of write enable input and synchronous set input | R | S | FIG. 36 | FIG. 30 | FIG. 4 | Q | QB |
| 7 | Latch with zero spacer of write enable input and self-timed reset input | S | R | FIG. 35 | FIG. 39 | FIG. 3 | Q | QB |
| 8 | Latch with zero spacer of write enable input and self-timed set input | R | S | FIG. 35 | FIG. 39 | FIG. 3 | QB | Q |
| 9 | Latch with unit spacer of write enable input and self-timed reset input | S | R | FIG. 36 | FIG. 40 | FIG. 4 | QB | Q |
| 10 | Latch with unit spacer of write enable input and self-timed set input | R | S | FIG. 36 | FIG. 40 | FIG. 4 | Q | QB |
| 11 | Flip-flop with zero spacer of write enable input | R | S | FIG. 27 | FIG. 32 | FIG. 4 | Q | QB |
| 12 | Flip-flop with unit spacer of write enable input | R | S | FIG. 28 | FIG. 31 | FIG. 3 | QB | Q |
| 13 | Flip-flop with zero spacer of write enable input and synchronous reset input | S | R | FIG. 37 | FIG. 32 | FIG. 4 | QB | Q |
| 14 | Flip-flop with zero spacer of write enable input and synchronous set input | R | S | FIG. 37 | FIG. 32 | FIG. 4 | Q | QB |
| 15 | Flip-flop with unit spacer of write enable input and synchronous reset input | S | R | FIG. 18 | FIG. 8 | FIG. 3 | Q | QB |
| 16 | Flip-flop with unit spacer of write enable input and synchronous set input | R | S | FIG. 18 | FIG. 8 | FIG. 3 | QB | Q |
| 17 | Flip-flop with zero spacer of write enable input and self-timed reset input | S | R | FIG. 19 | FIG. 23 | FIG. 4 | QB | Q |
| 18 | Flip-flop with zero spacer of write enable input and self-timed set input | R | S | FIG. 19 | FIG. 23 | FIG. 4 | Q | QB |
| 19 | Flip-flop with unit spacer of write enable input and self-timed reset input | S | R | FIG. 20 | FIG. 24 | FIG. 3 | Q | QB |
| 20 | Flip-flop with unit spacer of write enable input and self-timed set input | R | S | FIG. 20 | FIG. 24 | FIG. 3 | QB | Q |

Figure 45:
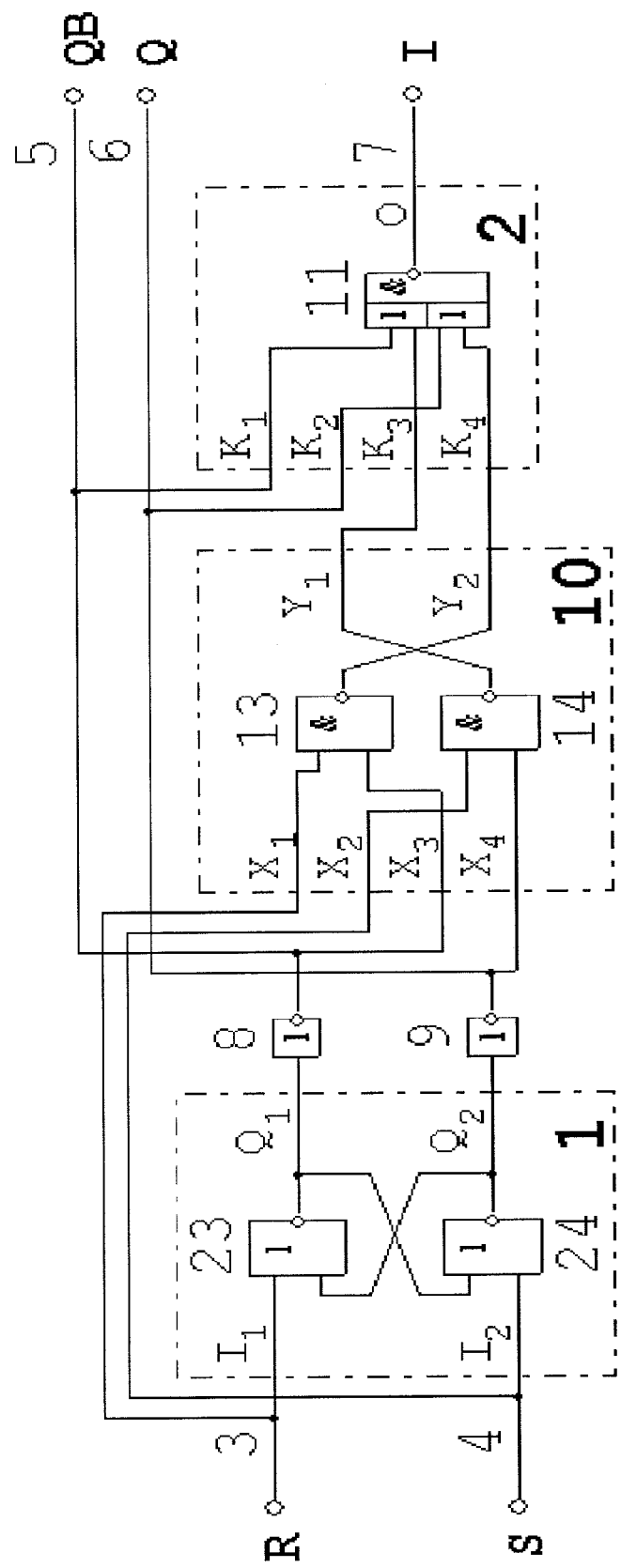
FIG. 45 demonstrates a realization of the self-timed RS-latch with the enhanced noise immunity having paraphase data input with zero spacer corresponding to the circuit in FIG. 1.

FIG. 45 demonstrates a realization of the self-timed RS-latch with the enhanced noise immunity having paraphase data input with zero spacer (a line 1 in Table 1) corresponding to the circuit in FIG. 1. It is composed from the circuits of storage unit (FIG. 10), preindication unit (FIG. 5) and indication unit (FIG. 3). The circuit operates as follows. At input spacer [R=S=0] the storage unit on base of elements 23 and 24 keeps the state, for example, [$Q_1$=0, $Q_2$=1], which is propagated through inverters 8 and 9 to paraphase data output [Q=0, QB=1]. Simultaneously input spacer causes the outputs of elements 13 and 14 to be in logic 1 state. This leads to forming low level (logic 0) at output of an element 11 and at trigger's indication output I. At applying the working state to the trigger's input [R=0, S=1] trigger's elements are switched into state [$Q_2$=0, $Q_1$=1, Q=1, QB=0, $Y_1$=0, $Y_2$=1], that forces an element 11, and accordingly the trigger's indication output I, to be switched into logic 1 state. Thus, the indication output of the self-timed RS-latch with the enhanced noise immunity having the paraphase data input with zero spacer traces a sequence of transition of the trigger from one phase of work into opposite, providing its self-timing.

Figure 46:
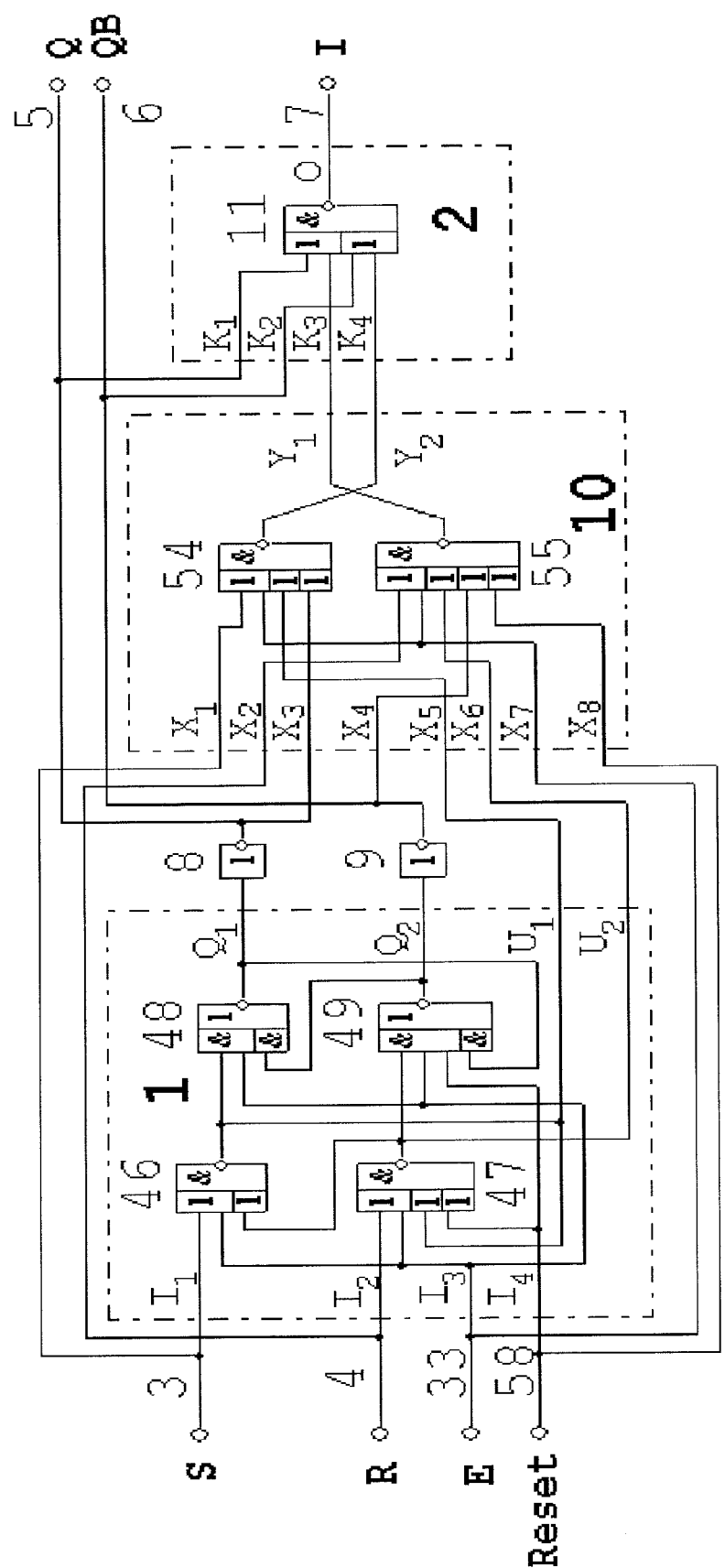
FIG. 46 shows a realization of the self-timed RS-flip-flop with the enhanced noise immunity having write enable input with unit spacer and self-timed preset input corresponding to the circuit in FIG. 34.

FIG. 46 shows a realization of the self-timed RS-flip-flop with the enhanced noise immunity having write enable input with unit spacer and self-timed preset input (a line 19 in Table 2) corresponding to the circuit in FIG. 34. It is composed from the circuits of storage unit (FIG. 42), preindication unit (FIG. 43) and indication unit (FIG. 3). Self-timed reset is performed as follows. Let an initial state of the paraphase data input to be [R=1, S=0]. At passive value of reset input (Reset=1) a high level (spacer) is applied to the write enable input E (E=1).

After termination of the trigger's transition into a phase of updating state of the paraphase data output [Q=1, QB=0], the indication output I is switched into logic 1 (I=1), allowing for beginning self-timed preset. Then low level is applied to reset input (Reset=0). As a result, outputs of the elements 46 and 47 are consistently switched into the following states (hereinafter names of outputs of the elements which have been not connected to external outputs, are composed from the letter "D" and element's circuit number): D47=1→D46=0. State of the trigger's data output does not change, as inputs of element D49 are locked by low level at reset input, and the indication output I will pass into state I=0 at termination of transition of elements 46, 54 and 55, thus proving the termination of first stage of self-timed reset. Then a passive level is again applied to the reset input (Reset=1), resolving transition of elements 49, 48, 8, 9, 55 and 11: D49=0→D48=1→[D8=0, D9=1]→ D55=0→D11=1. Occurrence of high level at the trigger's indication output (I=1) confirms the termination of the trigger's preset. Thus, the indication output of the self-timed RS-flip-flop with the enhanced noise immunity having write enable input with unit spacer and self-timed preset input traces the sequence of resetting trigger, providing self-timed character of this procedure.

At designing self-timed circuits, an important aspect is providing correct "request-acknowledge" interaction between circuit elements and units. An example of organization of such interaction of proposed self-timed RS-flip-flop with the enhanced noise immunity having the paraphase data input with zero spacer with an external environment is described below.

An event model lies in basis of the self-timed circuit operation, so an adequate mean described its work is a signal graph (SG). SG simultaneously is a formal mean for designed device specification, an evident mean for functional description and visual mean proving self-timed character of the device.

Figure 47:
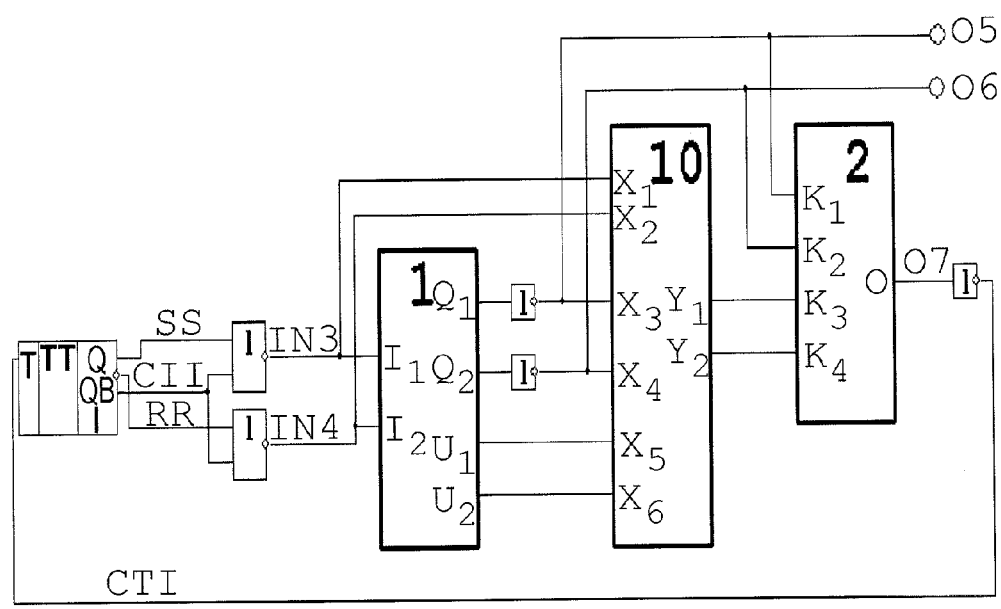
FIG. 47 presents a circuit for analysis of self-timing ability of the self-timed RS-flip-flop with the enhanced noise immunity having paraphase data input with zero spacer.
Figure 48:
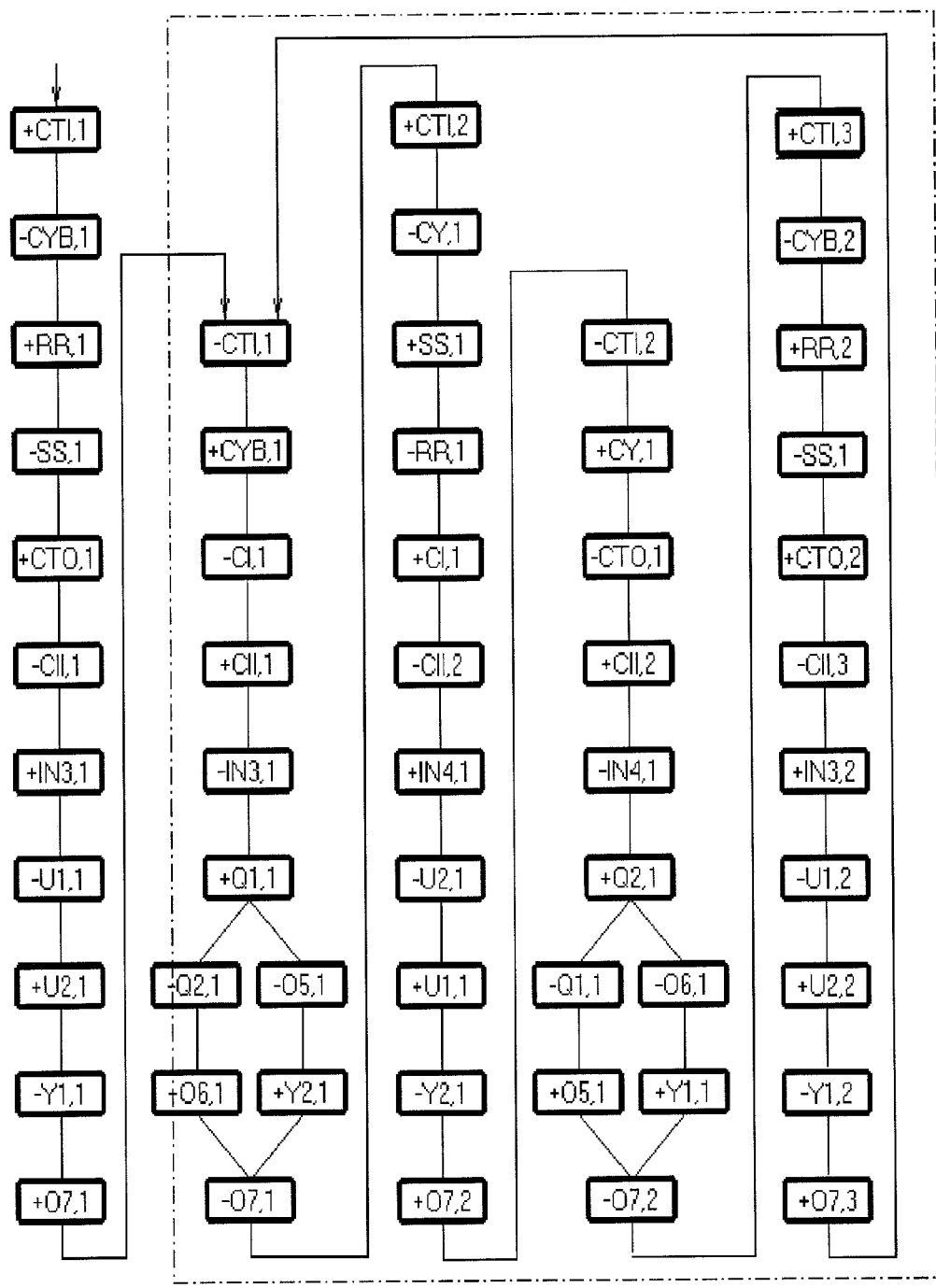
FIG. 48 demonstrates a signal graph of operation for the self-timed RS-flip-flop in FIG. 47.

FIG. 47 presents a circuit for self-timing analysis of proposed RS-flip-flop with the enhanced noise immunity having paraphase data input with zero spacer, corresponding to the circuit in FIG. 2 (a line 11 of Table 1). FIG. 48 demonstrates SG of its operation, proving self-timing of this RS-trigger. Signals in FIG. 48 have the names derivative of numbering corresponding inputs and outputs of the RS-flip-flop and its internal units in FIG. 2. Names of external inputs begin with "IN", while names of external outputs begin with "O". A sign "+" before a signal name designates its transition into high level state, and a sign "−" designates signal's transition into low level state.

A self-timed counting trigger "TT" together with a circuit of zero spacer generation on base of OR-NO elements is used for obtaining paraphase data input with spacer for the RS-flip-flop. The indication unit of the RS-flip-flop forms clock input for counting trigger, while counting trigger forms both paraphase data input for the RS-flip-flop and own indication signal CII controlling the termination of switch processes of counting trigger's elements. At the same time it plays a role of a control signal of a phase of the data input of the RS-flip-flop. Such environment provides continuous alternation of phases of work of the RS-flip-flop: just after work phase termination (low level at indication output O7), transition into a spacer phase (a mode of keeping state at data output O5, O6) of the RS-flip-flop is initiated, and vice-versa.

Initial state at the RS-flip-flop's inputs and outputs: [IN3=0, IN4=0, O5=1, O6=0, O7=0]. Signals CY, CYB, CTO, and CI are the internal signals of counting TT trigger. The work beginning is initiated by switching paraphase data input (+IN3, 1) into a working state [IN3=1, IN4=0]. As seen in FIG. 48, it causes change of the states of an input bistable cell (signals $U_1$, $U_2$), preindication and indication units of the RS-flip-flop, and state of indication output (+O7, 1). The data output O5, O6 of the trigger changes only after switching paraphase data input of the trigger into zero spacer (−IN3, 1). Finally, it leads to switching elements of the output bistable cell of the storage unit with outputs $Q_1$, $Q_2$, as well as inverters (−O5, 1; +O6, 1). Note, that no constraints are imposed for the delay of any element. An initiation of each next event (node of SG) is possible only after occurrence of previous parent event.

Transition of the output of the indication unit (−O7, 1) reflects the termination of switching trigger into a new output state: [O5=0, O6=1],—and initiates a new cycle of transition during which the trigger's output state becomes as [O5=1, O6=0], coinciding with the initial. Operation of the self-timed RS-flip-flop in a mode of the simple short circuit shown in FIG. 47 is cyclic. In FIG. 48, a cyclic part of the SG is shown by dash-and-dot line.

Thus, the presented SG illustrating a work of the self-timed RS-flip-flop with the enhanced noise immunity and paraphase data input with zero spacer proves self-timing of the proposed decision. Similar SG one can also obtain for other variants of realization of the self-timed RS-trigger with the enhanced noise immunity.

INDUSTRIAL APPLICABILITY

Self-timed RS-trigger with the enhanced noise immunity relates to pulse and computational technique and may be used for designing self-timed triggers, register and computational units, as well as in digital signal processing systems.

REFERENCES

[1] Шило В Л. Популярные цифровые микросхемы: Справочник. 2-е изд., испр- Челябинск: Металлургия, Челябинское отд. 1989.-р и с.1.54а.
[2] A. Bystrov, D. Shang, F. Xia and A. Yakovlev Self-timed and speed independent latch circuits//In Proc. 6$^{th}$ U.K. Timed Forum, Univ. Manchester, 1999, pp. 1-11.
[3] Астахановский А.Г., Варшавский В. и Мараховский В. Би др. Апериодические автоматы. //По иред В и.Варшавского.-М.: Наука, 1976, 424 с.

The invention claimed is:

1. Self-timed RS-trigger with the enhanced noise immunity having paraphase data input and comprising a storage unit, an indication unit, the first and second components of the paraphase data input, first and second components of a paraphase data output and an indication output, wherein first and second components of the paraphase data input are connected to first and second inputs of the storage unit accordingly, first component of the trigger's paraphase data output is connected to first input of the indication unit, second component of the trigger's paraphase data output is connected to second input of the indication unit, the trigger's indication output is connected to an output of the indication unit, characterized by that two inverters and a preindication unit are added, wherein first and second inputs of the preindication unit are connected to first and second components of the paraphase data input respectively, an input of first inverter is connected to first output of the storage unit, an output of first inverter is connected to first component of the trigger's paraphase data output and to third input of the preindication unit, an input of second inverter is connected to second output of the storage unit, an output of second inverter is connected to second component of the trigger's paraphase data output and to fourth input of the preindication unit, first and second outputs of the preindication unit are connected to third and fourth inputs of the indication unit accordingly, a paraphase input with spacer is used as the trigger's data input, and the self-timed RS-trigger is RS-latch.

2. Self-timed RS-trigger with the enhanced noise immunity according to claim 1, characterized by that trigger's preset input, third input of the storage unit and fifth input of the preindication unit are added being connected together, wherein preset is self-timed, the preset type (set or reset) is determined by both a functional characteristic of components of the trigger's paraphase data input and a type of paraphase data input spacer.

3. Self-timed RS-trigger with the enhanced noise immunity according to claim 1, characterized by that the storage unit consists of two OR-NO elements, first and second inputs of first OR-NO element are connected to first input and second output of the storage unit accordingly, first and second inputs of second OR-NO element are connected to first output and second input of the storage unit accordingly, outputs of first and second OR-NO elements are connected to first and second outputs of the storage unit accordingly, the preindication unit consists of two AND-NO elements, wherein first and second inputs of first AND-NO element are connected to first and third inputs of the preindication unit accordingly, first and second inputs of second AND-NO element are connected to second and fourth inputs of the preindication unit accordingly, outputs of first and second AND-NO elements are connected to second and first outputs of the preindication unit accordingly, and the trigger's paraphase data input has zero spacer.

4. Self-timed RS-trigger with the enhanced noise immunity according to claim 1, characterized by that the storage unit consists of two AND-NO elements, wherein first and second inputs of first AND-NO element are connected to first input and second output of the storage unit accordingly, first and second inputs of second AND-NO element are connected to first output and second input of the storage unit accordingly, outputs of first and second AND-NO elements are connected to first and second outputs of the storage unit accordingly, the preindication unit consists of two OR-NO elements, first and second inputs of first OR-NO element are connected to first and third inputs of the preindication unit accordingly, first and second inputs of second OR-NO element are connected to second and fourth inputs of the preindication unit accordingly, outputs of first and second OR-NO elements are connected to second and first outputs of the preindication unit accordingly, and the trigger's paraphase data input has unit spacer.

5. Self-timed RS-trigger with the enhanced noise immunity according to claim 1, characterized by that the storage unit has third and fourth outputs, wherein fifth and sixth inputs are added to the preindication unit being connected to third and fourth outputs of the storage unit accordingly, and the self-timed RS-trigger is RS-flip-flop.

6. Self-timed RS-trigger with the enhanced noise immunity according to claim 2, characterized by that the storage unit consists of two OR-NO elements, wherein first and second inputs of first OR-NO element are connected to first input and second output of the storage unit accordingly, first and second inputs of second OR-NO element are connected to first output and second input of the storage unit accordingly, outputs of first and second OR-NO elements are connected to first and second outputs of the storage unit accordingly, third input of second OR-NO element is connected to third input of the storage unit, the preindication unit consists of AND-NO element and OR-AND-NO element, first and second inputs of AND-NO element are connected to first and third inputs of the preindication unit accordingly, an output of AND-NO element is connected to second output of the preindication unit, first and second inputs of first OR input group of OR-AND-NO element are connected to second and fifth inputs of the preindication unit accordingly, an input of second OR input group of OR-AND-NO element is connected to fourth input of the preindication unit, an output of OR-AND-NO element is connected to first output of the preindication unit, and the paraphase data input has zero spacer.

7. Self-timed RS-trigger with the enhanced noise immunity according to claim 2, characterized by that the storage unit consists of two AND-NO elements, wherein first and second inputs of first AND-NO element are connected to first input and second output of the storage unit accordingly, first and second inputs of second AND-NO element are connected to first output and second input of the storage unit accordingly, outputs of first and second AND-NO elements are connected to first and second outputs of the storage unit accordingly, third input of second AND-NO element is connected to third input of the storage unit, the preindication unit consists of OR-NO element and AND-OR-NO element, wherein first and second inputs of OR-NO element are connected to first and third inputs of the preindication unit accordingly, an output of OR-NO element is connected to second output of the preindication unit, first and second inputs of first AND input group of AND-OR-NO element are connected to second and fifth inputs of the preindication unit accordingly, an input of second AND input group of AND-OR-NO element is connected to fourth input of the preindication unit, an output of AND-OR-NO element is connected to first output of the preindication unit, and the paraphase data input has unit spacer.

8. Self-timed RS-trigger with the enhanced noise immunity according to claim 5, characterized by that trigger's preset input, third input of the storage unit and seventh input of the preindication unit are added being connected together, wherein preset is self-timed, the preset type (set or reset) is determined by both a functional characteristic of components of the trigger's paraphase data input and a type of its spacer.

9. Self-timed RS-trigger with the enhanced noise immunity according to claim 5, characterized by that the storage unit consists the first and second OR-NO elements and two OR-AND-NO elements, wherein first input of first OR-NO element is connected to first input of the storage unit and to first input of first OR input group of first OR-AND-NO element, an output of first OR-NO element is connected to first input of second OR-NO element, to second input of first OR input group of first OR-AND-NO element and to third output of the storage unit, second input of second OR-NO element is connected to second input of the storage unit and to second input of first OR input group of second OR-AND-NO element, an output of second OR-NO element is connected to second input of first OR-NO element, to first input of first OR input group of second OR-AND-NO element and to fourth output of the storage unit, an output of first OR-AND-NO element is connected to an input of second OR input group of second OR-AND-NO element and to first output of the storage unit, an output of second OR-AND-NO element is connected to an input of second OR input group of first OR-AND-NO element and to second output of the storage unit, the preindication unit consists of third and fourth OR-NO elements, wherein first, second and third inputs of third OR-NO element are connected to first, third and fifth inputs of the preindication unit accordingly, first, second and third inputs of fourth OR-NO element are connected to second, fourth and sixth inputs of the preindication unit accordingly, outputs of fourth and third OR-NO elements are connected to first and second outputs of the preindication unit accordingly, and the paraphase data input has zero spacer.

10. Self-timed RS-trigger with the enhanced noise immunity according to claim 9, characterized by that trigger's preset input and third input of second OR-NO element of the storage unit are added being connected together, wherein preset is synchronous.

11. Self-timed RS-trigger with the enhanced noise immunity according to claim 10, characterized by that third input is added into first OR input group of second element OR-AND-NO, and fourth input is added into fourth OR-NO element, both added inputs are connected to the trigger's preset input, wherein the preset is self-timed.

12. Self-timed RS-trigger with the enhanced noise immunity according to claim 5, characterized by that the storage unit consists first and second AND-NO elements and two AND-OR-NO elements, first input of first AND-NO element is connected to first input of the storage unit and to first input of first AND input group of first AND-OR-NO element, an output of first AND-NO element is connected to first input of second AND-NO element, to second input of first AND input group of first AND-OR-NO element and to third output of the storage unit, second input of second AND-NO element is connected to second input of the storage unit and to second input of first AND input group of second AND-OR-NO element, an output of second AND-NO element is connected to second input of first AND-NO element, to first input of first AND input group of second AND-OR-NO element and to fourth output of the storage unit, an output of first AND-NO element is connected to an input of second AND input group of second AND-OR-NO element and to first output of the storage unit, an output of second AND-OR-NO element is connected to an input of second AND input group of first AND-OR-NO element and to second output of the storage unit, the preindication unit consists of third and fourth AND-NO elements, wherein first, second and third inputs of third AND-NO element are connected to first, third and fifth inputs of the preindication unit accordingly, first, second and third inputs of fourth AND-NO element are connected to second, fourth and sixth inputs of the preindication unit accordingly, outputs of fourth and third AND-NO elements are connected to first and second outputs of the preindication unit accordingly, and the paraphase data input has unit spacer.

13. Self-timed RS-trigger with the enhanced noise immunity according to claim 12, characterized by that trigger's preset input and third input of second AND-NO element of the storage unit are added being connected together, wherein preset is synchronous.

14. Self-timed RS-trigger with the enhanced noise immunity according to claim 13, characterized by that third input is added into first AND input group of second element AND-OR-NO, and fourth input is added into fourth AND-NO element, both added inputs are connected to the preset input, wherein the preset is self-timed.

15. Self-timed RS-trigger with the enhanced noise immunity according to any one of claim 3, 6, 12, 13, or 14, characterized by that the indication unit consists of OR-AND-NO element, wherein first and second inputs of first OR input group of OR-AND-NO element are connected to first and third inputs of the indication unit accordingly, first and second inputs of second OR input group of OR-AND-NO element are connected to second and fourth inputs of the indication unit accordingly, an output of OR-AND-NO element is connected to the output of the indication unit.

16. Self-timed RS-trigger with the enhanced noise immunity according to any one of claim 4, 7, 9, 10, or 11, characterized by that the indication unit consists of AND-OR-NO element, wherein first and second inputs of first AND input group of AND-OR-NO element are connected to first and third inputs of the indication unit accordingly, first and second inputs of second AND input group of AND-OR-NO element are connected to second and fourth inputs of the indication unit accordingly, an output of AND-OR-NO element is connected to the output of the indication unit.

17. Self-timed RS-trigger with the enhanced noise immunity having paraphase data input and write enable input, comprising a storage unit, an indication unit, first and second components of the paraphase data input, first and second components of a paraphase data output and an indication output, wherein first and second components of the paraphase data input are connected to first and second inputs of the storage unit respectively, the write enable input is connected to third input of the storage unit, first component of the trigger's paraphase data output is connected to first input of the indication unit, second component of the trigger's paraphase data output is connected to second input of the indication unit, the trigger's indication output is connected to the output of the indication unit, characterized by that two inverters and preindication unit are added, wherein first and second inputs of the preindication unit are connected to first and second components of the paraphase data input accordingly, an input of first inverter is connected to first output of the storage unit, an output of first inverter is connected to first component of the trigger's paraphase data output and to third input of the preindication unit, an input of second inverter is connected to second output of the storage unit, an output of second inverter is connected to second component of the trigger's paraphase data output and to fourth input of the preindication unit, fifth input of the preindication unit is connected to the write enable input, first and second outputs of the preindication unit are connected to third and fourth inputs of the indication unit, and the self-timed RS-trigger is RS-latch.

18. Self-timed RS-trigger with the enhanced noise immunity having paraphase data input and write enable input according to claim 17, characterized by that a preset input of the trigger, fourth input of the storage unit and sixth input of the preindication unit are added being connected together, preset is self-timed, wherein the preset type (set or reset) is determined by both a functional characteristic of components of the trigger's paraphase data input and a type of spacer of the write enable input.

19. Self-timed RS-trigger with the enhanced noise immunity having paraphase data input and write enable input according to claim 17, characterized by that the storage unit consists of two AND-OR-NO elements, first inputs of first AND input groups of first and second AND-OR-NO elements are connected to first and second inputs of the storage unit accordingly, second inputs of first AND input groups of first and second AND-OR-NO elements are connected to third input of the storage unit, an output of first AND-OR-NO element is connected to first output of the storage unit and to an input of second AND input group of second AND-OR-NO element whose output is connected to second output of the storage unit and to an input of second AND input group of first AND-OR-NO element, wherein the preindication unit consists of two AND-NO elements, first inputs of first and second AND-NO elements are connected to first and second inputs of the preindication unit accordingly, second inputs of first and second AND-NO elements are connected to third and fourth inputs of the preindication unit accordingly, third inputs of first and second AND-NO elements are connected to fifth input of the preindication unit, outputs of first and second AND-NO elements are connected to second and first outputs of the preindication unit accordingly, and the write enable input has zero spacer.

20. Self-timed RS-trigger with the enhanced noise immunity having paraphase data input and write enable input according to claim 17, characterized by that the storage unit consists of two OR-AND-NO elements, wherein first inputs of first OR input groups of first and second OR-AND-NO elements are connected to first and second inputs of the storage unit accordingly, second inputs of first OR input groups of first and second OR-AND-NO elements are connected to third input of the storage unit, an output of first OR-AND-NO element is connected to first output of the storage unit and to an input of second OR input group of second OR-AND-NO element whose output is connected to second output of the storage unit and to an input of second OR input group of first OR-AND-NO element, wherein the preindication unit consists of two OR-NO elements, first inputs of first and second OR-NO elements are connected to first and second inputs of the preindication unit accordingly, second inputs of first and second OR-NO elements are connected to third and fourth inputs of the preindication unit accordingly, third inputs of first and second OR-NO elements are connected to fifth input of the preindication unit, outputs of first and second OR-NO elements are connected to second and first outputs of the preindication unit accordingly, and the write enable input has unit spacer.

21. Self-timed RS-trigger with the enhanced noise immunity having paraphase data input and write enable input according to claim 18, characterized by that the storage unit consists of first and second AND-OR-NO elements, wherein first inputs of first AND input groups of first and second AND-OR-NO elements are connected to first and second inputs of the storage unit accordingly, second inputs of first AND input groups of first and second AND-OR-NO elements are connected to third input of the storage unit, an output of first AND-OR-NO element is connected to first output of the storage unit and to an input of second AND input group of second AND-OR-NO element whose output is connected to second output of the storage unit and to an input of second AND input group of first AND-OR-NO element, an input of third AND input group of second AND-OR-NO element is connected to fourth input of the storage unit, the preindication unit consists of AND-NO element and third AND-OR-NO element, wherein first, second and third inputs of AND-NO element are connected to first, third and fifth inputs of the preindication unit accordingly, first, second and third inputs of first AND input group of third AND-OR-NO element are connected to second, fourth and fifth inputs of the preindication unit accordingly, first and second inputs of second AND input group of third AND-OR-NO element are connected to fourth and sixth inputs of the preindication unit accordingly, an output of AND-NO element is connected to second output of the preindication unit, an output of third AND-OR-NO element is connected to first output of the preindication unit, and the write enable input has zero spacer.

22. Self-timed RS-trigger with the enhanced noise immunity having paraphase data input and write enable input according to claim 18, characterized by that the storage unit consists of first and second OR-AND-NO elements, wherein first inputs of first OR input groups of first and second OR-AND-NO elements are connected to first and second inputs of the storage unit accordingly, second inputs of first OR input groups of first and second OR-AND-NO elements are connected to third input of the storage unit, an output of first OR-AND-NO element is connected to first output of the storage unit and to an input of second OR input group of second OR-AND-NO element whose output is connected to second output of the storage unit and to an input of second OR input group of first OR-AND-NO element, an input of third OR input group of second OR-AND-NO element is connected to fourth input of the storage unit, the preindication unit consists of OR-NO element and third OR-AND-NO element, wherein first, second and third inputs of OR-NO element are connected to first, third and fifth inputs of the preindication unit accordingly, first, second and third inputs of first OR input group of third OR-AND-NO element are connected to second, fourth and fifth inputs of the preindication unit accordingly, first and second inputs of second OR input group of third OR-AND-NO element are connected to fourth and sixth inputs of the preindication unit accordingly, an output of OR-NO element is connected to second output of the preindication unit, an output of third OR-AND-NO element is connected to first output of the preindication unit, and the write enable input has unit spacer.

23. Self-timed RS-trigger with the enhanced noise immunity having paraphase data input and write enable input according to claim 17, characterized by that third and fourth outputs are added to the storage unit, and sixth and seventh inputs are added to the preindication unit being connected to third and fourth outputs of the storage unit accordingly, and the self-timed RS-trigger is RS-flip-flop.

24. Self-timed RS-trigger with the enhanced noise immunity having paraphase data input and write enable input according to claim 23, characterized by that preset input of the trigger, fourth input of the storage unit and eighth input of the preindication unit are added being connected together, wherein preset is self-timed, the preset type (set or reset) is determined by both a functional characteristic of components of the trigger's paraphase data input and a type of spacer of the write enable input.

25. Self-timed RS-trigger with the enhanced noise immunity having paraphase data input and write enable input according to claim 23, characterized by that the storage unit consists of first and second AND-OR-NO elements and two OR-AND-NO elements, wherein first inputs of first AND input groups of first and second AND-OR-NO elements are connected to first and second inputs of the storage unit accordingly, second inputs of first AND input groups of first and second AND-OR-NO elements are connected to third input of the storage unit and to second inputs of first OR input groups of first and second OR-AND-NO elements, an output of first AND-OR-NO element is connected to first input of first OR input group of first OR-AND-NO element, to an input of second AND input group of second AND-OR-NO element and to third output of the storage unit, an output of second AND-OR-NO element is connected to first input of first OR input group of OR input groups of second OR-AND-NO element, to an input of second AND input group of first AND-OR-NO element and to fourth output of the storage unit, an output of first OR-AND-NO element is connected to first output of the storage unit and to an input of second OR input group of second OR-AND-NO element, whose output is connected to second output of the storage unit and to an input of second OR input group of first OR-AND-NO element, the preindication unit consists of third and fourth AND-OR-NO elements, wherein first and second inputs of first AND input group of third AND-OR-NO element are connected to first and fifth inputs of the preindication unit accordingly, inputs of second and third AND input groups of third AND-OR-NO element are connected to sixth and third inputs of the preindication unit accordingly, first and second inputs of first AND input group of fourth AND-OR-NO element are connected to second and fifth inputs of the preindication unit accordingly, inputs of second and third AND input group of fourth AND-OR-NO element are connected to seventh and fourth inputs of the preindication unit accordingly, the outputs of third and fourth AND-OR-NO elements are connected to second and first outputs of the preindication unit accordingly, and the write enable input has zero spacer.

26. Self-timed RS-trigger with the enhanced noise immunity having paraphase data input and write enable input according to claim 25, characterized by that preset input of the trigger, fourth input of the storage unit and eighth input of the preindication unit are added being connected together, third AND input group, whose input is connected to fourth input of the storage unit, is added to second AND-OR-NO element of the storage unit, third input is added to first OR input group of second OR-AND-NO element of the storage unit being connected to fourth input of the storage unit, fourth AND input group, whose input is connected to eighth input of the preindication unit, is added to fourth AND-OR-NO element.

27. Self-timed RS-trigger with the enhanced noise immunity having paraphase data input and write enable input according to claim 23, characterized by that the storage unit consists of first and second OR-AND-NO elements and two AND-OR-NO elements, first inputs of first OR input groups of first and second OR-AND-NO elements are connected to first and second inputs of the storage unit accordingly, second inputs of first OR input groups of first and second OR-AND-NO elements are connected to third input of the storage unit and to second inputs of first AND input groups of first and second AND-OR-NO elements, an output of first OR-AND-NO element is connected to first input of first AND input group of first AND-OR-NO element, to an input of second OR input group of second OR-AND-NO element and to third output of the storage unit, an output of second OR-AND-NO element is connected to first input of first AND input group of second AND-OR-NO element, to an input of second OR input group of first OR-AND-NO element and to fourth output of the storage unit, an output of first AND-OR-NO element is connected to first output of the storage unit and to an input of second AND input group of second AND-OR-NO element, whose output is connected to second output of the storage unit and to an input of second AND input group of first AND-OR-NO element, the preindication unit consists of third and fourth OR-AND-NO elements, wherein first and second inputs of first OR input group of third OR-AND-NO element are connected to first and fifth inputs of the preindication unit accordingly, inputs of second and third OR input groups of third OR-AND-NO element are connected to sixth and third inputs of the preindication unit accordingly, first and second inputs of first OR input group of fourth OR-AND-NO element are connected to second and fifth inputs of the preindication unit accordingly, inputs of second and third OR input group of fourth OR-AND-NO element are connected to seventh and fourth inputs of the preindication unit accordingly, the outputs of third and fourth OR-AND-NO elements are connected to second and first outputs of the preindication unit accordingly, and the write enable input has unit spacer.

28. Self-timed RS-trigger with the enhanced noise immunity having paraphase data input and write enable input according to claim 27, characterized by that preset input of the trigger, fourth input of the storage unit and eighth input of the preindication unit are added being connected together, third OR input group, whose input is connected to fourth input of the storage unit, is added to second OR-AND-NO element of the storage unit, third input is added to first AND input group of second AND-OR-NO element of the storage unit being connected to fourth input of the storage unit, fourth OR input group, whose input is connected to eighth input of the preindication unit, is added to fourth OR-AND-NO element.

29. Self-timed RS-trigger with the enhanced noise immunity having paraphase data input and write enable input according to any one of claim 19, 21, 27, or 28, characterized by that the indication unit consists of OR-AND-NO element, whose first and second inputs of first OR input group are connected to first and third inputs of the indication unit accordingly, first and second inputs of second OR input group of OR-AND-NO element are connected to second and fourth inputs of the indication unit accordingly, an output of OR-AND-NO element is connected to the output of the indication unit.

30. Self-timed RS-trigger with the enhanced noise immunity having paraphase data input and write enable input according to any one of claim 20, 22, 25, or 26, characterized by that the indication unit consists of AND-OR-NO element, whose first and second inputs of first AND input group are connected to first and third inputs of the indication unit accordingly, first and second inputs of second AND input group of AND-OR-NO element are connected to second and fourth inputs of the indication unit accordingly, an output of AND-OR-NO element is connected to the output of the indication unit.

* * * * *